United States Patent

Yamazaki et al.

(10) Patent No.: US 10,566,455 B2
(45) Date of Patent: Feb. 18, 2020

(54) SEMICONDUCTOR DEVICE AND MANUFACTURING METHOD THEREOF

(71) Applicant: Semiconductor Energy Laboratory Co., Ltd., Atsugi-shi, Kanagawa-ken (JP)

(72) Inventors: Shunpei Yamazaki, Setagaya (JP);
Masami Jintyou, Shimotsuga (JP);
Yasutaka Nakazawa, Tochigi (JP);
Yukinori Shima, Tatebayashi (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 303 days.

(21) Appl. No.: 14/220,681

(22) Filed: Mar. 20, 2014

(65) Prior Publication Data

US 2014/0291672 A1    Oct. 2, 2014

(30) Foreign Application Priority Data

Mar. 28, 2013    (JP) .................................. 2013-069163

(51) Int. Cl.
*H01L 29/786*    (2006.01)
*H01L 27/12*    (2006.01)

(52) U.S. Cl.
CPC ...... *H01L 29/78618* (2013.01); *H01L 27/124* (2013.01); *H01L 27/1225* (2013.01); *H01L 27/1259* (2013.01); *H01L 29/7869* (2013.01)

(58) Field of Classification Search
CPC ...... H01L 27/1259–27/1296; H01L 29/41733; H01L 29/78618; H01L 21/823418; H01L 21/823814; H01L 29/0843–29/0886
See application file for complete search history.

(56) References Cited

U.S. PATENT DOCUMENTS 6,872,603 B2 * 3/2005 Doi ................. H01L 29/41733
257/E21.414
7,229,863 B2 * 6/2007 Wu .................. H01L 29/41733
257/E21.094

(Continued)

FOREIGN PATENT DOCUMENTS

EP         2674981 A    12/2013
JP    2002-110631 A     4/2002
(Continued)

*Primary Examiner* — Stephen W Smoot
*Assistant Examiner* — Sun Mi Kim King
(74) *Attorney, Agent, or Firm* — Robinson Intellectual Property Law Office; Eric J. Robinson

(57) ABSTRACT

The stability of steps of processing a wiring formed using copper or the like is increased. The concentration of impurities in a semiconductor film is reduced. Electrical characteristics of a semiconductor device are improved. A semiconductor device includes a semiconductor film, a pair of first protective films in contact with the semiconductor film, a pair of conductive films containing copper or the like in contact with the pair of first protective films, a pair of second protective films in contact with the pair of conductive films on the side opposite the pair of first protective films, a gate insulating film in contact with the semiconductor film, and a gate electrode overlapping with the semiconductor film with the gate insulating film therebetween. In a cross section, side surfaces of the pair of second protective films are located on the outer side of side surfaces of the pair of conductive films.

27 Claims, 15 Drawing Sheets

(56) References Cited

U.S. PATENT DOCUMENTS

| | | |
|---|---|---|
| 7,652,740 B2 | 1/2010 | Hwang et al. |
| 8,013,974 B2 * | 9/2011 | Jung ................... H01L 27/1288 349/149 |
| 8,030,643 B2 | 10/2011 | Asami et al. |
| 8,238,152 B2 | 8/2012 | Asami et al. |
| 8,269,220 B2 | 9/2012 | Ryu et al. |
| 8,344,374 B2 | 1/2013 | Yamazaki et al. |
| 8,409,935 B2 | 4/2013 | Ryu et al. |
| 8,502,220 B2 | 8/2013 | Yamazaki et al. |
| 8,526,216 B2 | 9/2013 | Asami et al. |
| 8,546,198 B2 | 10/2013 | Ryu et al. |
| 8,546,199 B2 | 10/2013 | Ryu et al. |
| 8,804,404 B2 | 8/2014 | Asami et al. |
| 8,952,377 B2 | 2/2015 | Yamazaki et al. |
| 9,024,322 B2 | 5/2015 | Miki et al. |
| 9,070,600 B2 | 6/2015 | Katsui et al. |
| 9,129,866 B2 | 9/2015 | Asami et al. |
| 9,196,745 B2 | 11/2015 | Yamazaki et al. |
| 9,437,743 B2 | 9/2016 | Mizoguchi et al. |
| 9,466,756 B2 | 10/2016 | Yamazaki et al. |
| 9,530,897 B2 | 12/2016 | Yamazaki et al. |
| 9,786,669 B2 | 10/2017 | Asami et al. |
| 10,043,918 B2 | 8/2018 | Yamazaki et al. |
| 2002/0117736 A1 * | 8/2002 | Yamazaki ................ H01L 29/04 257/627 |
| 2010/0025677 A1 * | 2/2010 | Yamazaki ............ H01L 27/1225 257/43 |
| 2010/0140613 A1 * | 6/2010 | Kimura ................ H01L 27/1225 257/43 |
| 2011/0031493 A1 * | 2/2011 | Yamazaki ............ H01L 27/1214 257/43 |
| 2011/0254002 A1 * | 10/2011 | Ahn ...................... H01L 27/1214 257/49 |
| 2013/0032793 A1 | 2/2013 | Kim et al. |
| 2014/0021466 A1 * | 1/2014 | Yamazaki .............. H01L 29/201 257/43 |
| 2016/0336459 A1 | 11/2016 | Mizoguchi et al. |
| 2017/0005118 A1 | 1/2017 | Yamazaki et al. |
| 2017/0069765 A1 | 3/2017 | Yamazaki et al. |
| 2018/0366588 A1 | 12/2018 | Yamazaki et al. |

FOREIGN PATENT DOCUMENTS

| | | |
|---|---|---|
| JP | 2004-133422 A | 4/2004 |
| JP | 2006-310799 A | 11/2006 |
| JP | 2010-147458 A | 7/2010 |
| JP | 2011-054957 A | 3/2011 |
| JP | 2012-018970 A | 1/2012 |
| JP | 2012-099796 A | 5/2012 |
| JP | 2012-243779 A | 12/2012 |
| JP | 2013-033927 A | 2/2013 |
| JP | 2013-038399 A | 2/2013 |
| WO | WO-2012/108301 | 8/2012 |

* cited by examiner

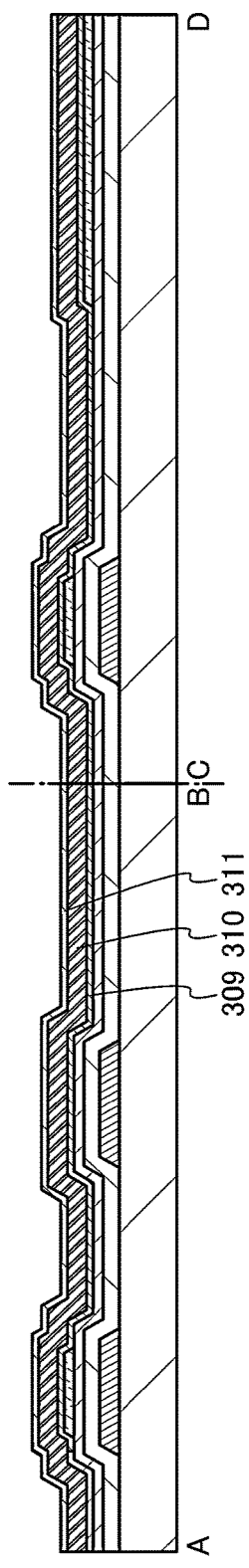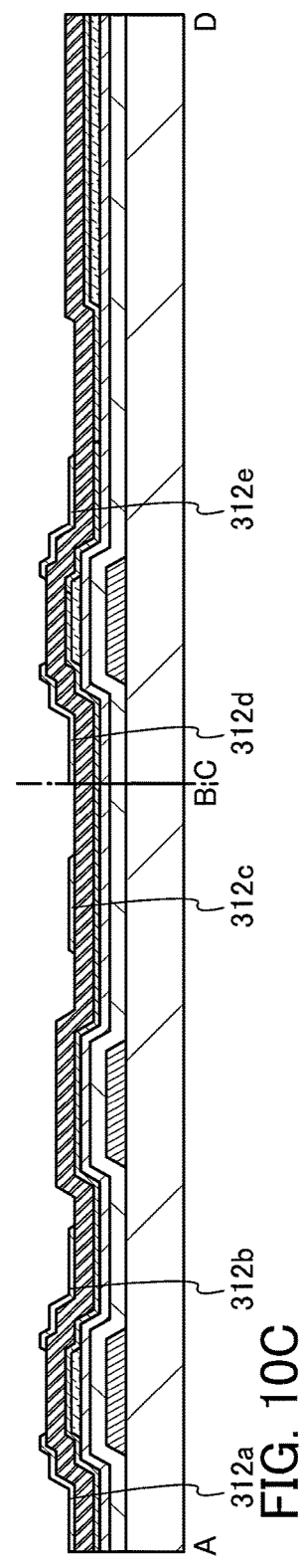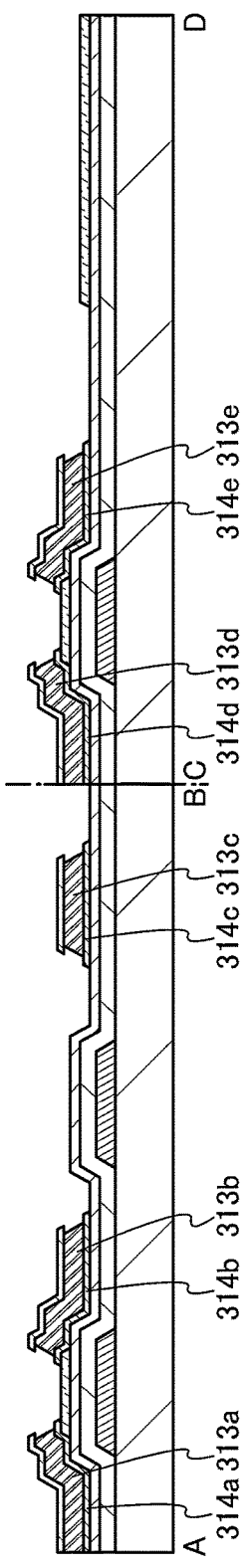

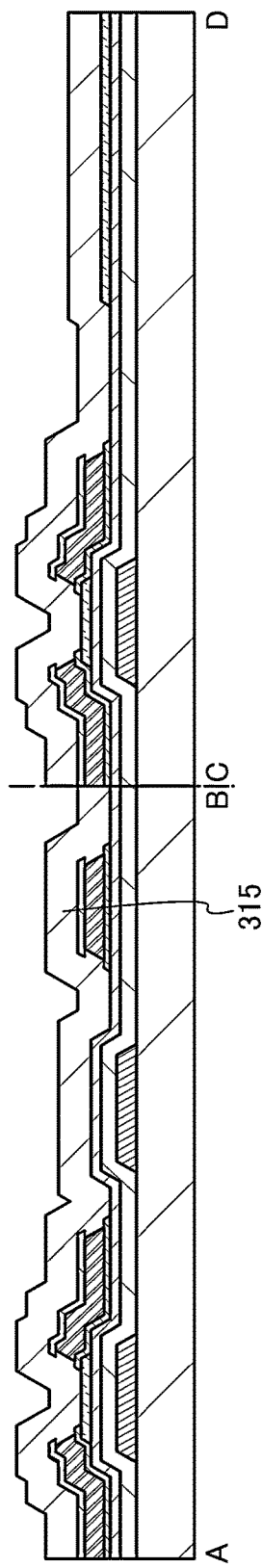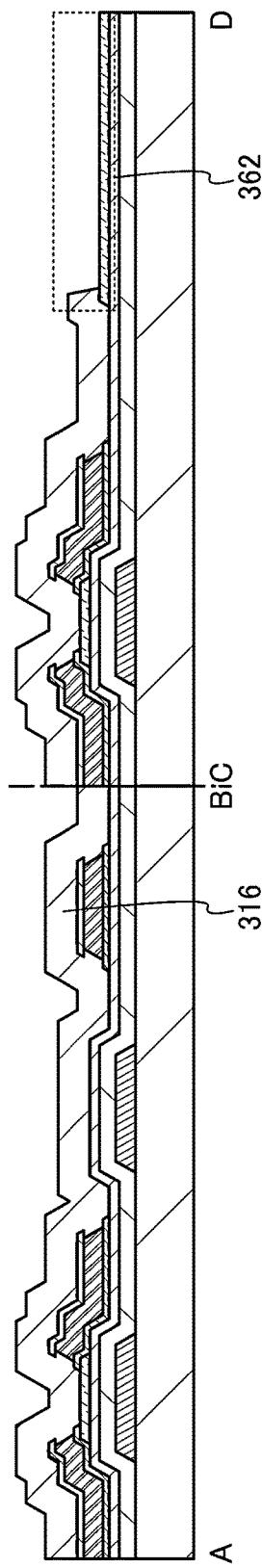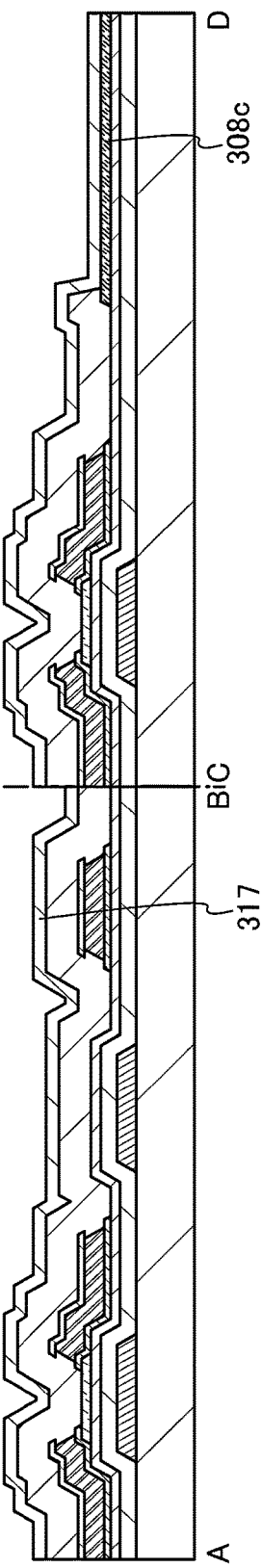

SEMICONDUCTOR DEVICE AND MANUFACTURING METHOD THEREOF

BACKGROUND OF THE INVENTION

1. Field of the Invention

The present invention relates to a semiconductor device including a transistor and a method for manufacturing the semiconductor device.

2. Description of the Related Art

Transistors used for most flat panel displays typified by a liquid crystal display device or a light-emitting display device are formed using a silicon semiconductor such as amorphous silicon, single crystal silicon, or polycrystalline silicon provided over a glass substrate. Further, such a transistor employing the silicon semiconductor is used in integrated circuits (ICs) and the like.

Further, in accordance with increasing size and increasing definition of a flat panel display, the driving frequency is increased and the resistance and the parasitic capacitance of a wiring are increased, so that wiring delay occurs. In order to inhibit the wiring delay, a technique for forming a wiring using copper has been studied (Patent Document 1).

REFERENCE

Patent Document

[Patent Document 1] Japanese Published Patent Application No. 2004-133422

SUMMARY OF THE INVENTION

However, there are problems in that copper, aluminum, gold, silver, molybdenum, or the like, which is a constituent element of the wiring, is difficult to process, and they are diffused in a semiconductor film in the course of the processing.

Copper, aluminum, gold, silver, molybdenum, or the like, which is a constituent element of the wiring, is one of impurities causing poor electrical characteristics of a transistor. Therefore, there is a problem in that mixing of the impurities into a semiconductor film reduces the resistance of the semiconductor film and the amount of change in electrical characteristics, typically in threshold voltage, of the transistor is increased by change over time or a stress test.

Thus, an object of one embodiment of the present invention is to increase the stability of a step of processing a wiring formed using copper, aluminum, gold, silver, molybdenum, or the like. Another object of one embodiment of the present invention is to reduce the concentration of impurities in a semiconductor film. Another object of one embodiment of the present invention is to improve electrical characteristics of a semiconductor device. Another object of one embodiment of the present invention is to improve reliability of a semiconductor device. Another object of one embodiment of the present invention is to realize high speed operation of a semiconductor device. Another object of one embodiment of the present invention is to realize a reduction in power consumption of a semiconductor device. Another object of one embodiment of the present invention is to realize a semiconductor device having excellent yield. Note that in one embodiment of the present invention, there is no need to achieve all the objects.

One embodiment of the present invention is a semiconductor device which includes a semiconductor film, a pair of first protective films in contact with the semiconductor film, a pair of conductive films containing copper, aluminum, gold, silver, or molybdenum in contact with the pair of first protective films, a pair of second protective films in contact with the pair of conductive films on the side opposite the pair of first protective films, a gate insulating film in contact with the semiconductor film, and a gate electrode overlapping with the semiconductor film with the gate insulating film provided therebetween. In a cross section, side surfaces of the pair of second protective films are located on the outer side of side surfaces of the pair of conductive films.

One embodiment of the present invention is a method for manufacturing a semiconductor device which includes the following steps: forming a film to be a pair of first protective films, a conductive film containing copper, aluminum, gold, silver, or molybdenum, and a film to be a pair of second protective films over a semiconductor film; forming a first mask over the film to be the pair of second protective films; forming the pair of second protective films by etching part of the film to be the pair of second protective films by using the first mask; and forming the pair of first protective films and a pair of conductive films by etching part of the conductive film and part of the film to be the pair of first protective films by using the pair of second protective films as a second mask after removing the first mask.

One embodiment of the present invention is a method for manufacturing a semiconductor device which includes the following steps: forming a film to be a pair of first protective films, a conductive film containing copper, aluminum, gold, silver, or molybdenum, and a film to be a pair of second protective films over a semiconductor film; forming a first mask over the film to be the pair of second protective films; forming the pair of second protective films and a pair of conductive films by etching part of the film to be the pair of second protective films and part of the conductive film by using the first mask; and forming the pair of first protective films by etching part of the film to be the pair of first protective films by using the pair of second protective films as a mask after removing the first mask.

Note that the semiconductor film can be formed using a semiconductor element such as silicon, germanium, gallium arsenide, or gallium nitride as appropriate. Alternatively, the semiconductor film can be formed using an oxide semiconductor containing In, Ga, or Zn.

In a transistor included in the semiconductor device of one embodiment of the present invention, each of a pair of electrodes has a stacked-layer structure of at least the first protective film and the conductive film, and the second protective film whose side surface is located on the outer side of the conductive film is provided over the conductive film. Because an upper surface of the conductive film is covered with the second protective film and the side surface of the second protective film is located on the outer side of the conductive film, the area of the conductive film exposed to plasma, e.g., oxygen plasma, is decreased. Accordingly, the formation of a compound of the metal element contained in the conductive film by plasma irradiation is suppressed, and the metal element contained in the conductive film is unlikely to move to the semiconductor film.

In addition, because the semiconductor film is covered with the first protective film when the conductive film is processed into the conductive films of the pair of electrodes, the metal element contained in the conductive films is blocked by the first protective film and is unlikely to move to the semiconductor film.

Consequently, diffusion of an impurity which is a constituent element of wirings and electrodes, such as copper, aluminum, gold, silver, or molybdenum, into the semiconductor film can be suppressed. In addition, the concentration of the impurity in the semiconductor film can be decreased.

In one embodiment of the present invention, in a semiconductor device including an oxide semiconductor film, defects in the oxide semiconductor film can be reduced. Further, in one embodiment of the present invention, in a semiconductor device or the like including an oxide semiconductor film, impurities in the oxide semiconductor film can be reduced. Further, in one embodiment of the present invention, the electrical characteristics of a semiconductor device including an oxide semiconductor film can be improved. Further, in one embodiment of the present invention, the reliability of a semiconductor device including an oxide semiconductor film can be improved.

BRIEF DESCRIPTION OF THE DRAWINGS

FIGS. 10A to 10C are cross-sectional views illustrating one embodiment of a method for manufacturing a semiconductor device.

FIGS. 11A to 11C are cross-sectional views illustrating one embodiment of a method for manufacturing a semiconductor device.

DETAILED DESCRIPTION OF THE INVENTION

Figure 1A:
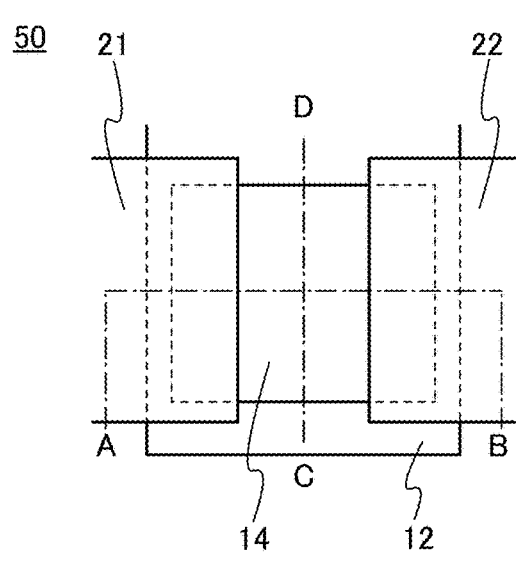
FIGS. 1A to 1C are a top view and cross-sectional views illustrating one embodiment of a transistor.

Embodiments of the present invention will be described in detail below with reference to drawings. Note that the present invention is not limited to the following description, and it is easily understood by those skilled in the art that various changes and modifications can be made without departing from the spirit and scope of the present invention. Therefore, the present invention should not be construed as being limited to the description in the following embodiments and examples. In addition, in the following embodiments and examples, the same portions or portions having similar functions are denoted by the same reference numerals or the same hatching patterns in different drawings, and description thereof will not be repeated.

Note that in each drawing described in this specification, the size, the film thickness, or the region of each component is exaggerated for clarity in some cases. Therefore, embodiments and examples of the present invention are not necessarily limited to such scales.

Furthermore, terms such as "first", "second", and "third" in this specification are used in order to avoid confusion among components, and the terms do not limit the components numerically. Therefore, for example, the term "first" can be replaced with the term "second", "third", or the like as appropriate.

Functions of a "source" and a "drain" are sometimes interchanged with each other when the direction of current flowing is changed in circuit operation, for example. Therefore, the terms "source" and "drain" can be used to denote the drain and the source, respectively, in this specification.

A voltage refers to a difference between potentials of two points, and a potential refers to electrostatic energy (electric potential energy) of a unit charge at a given point in an electrostatic field. Note that in general, a difference between a potential of one point and a reference potential (e.g., a ground potential) is simply called a potential or a voltage, and a potential and a voltage are used as synonymous words in many cases. Thus, in this specification, a potential may be rephrased as a voltage and a voltage may be rephrased as a potential unless otherwise specified.

In this specification, in the case where an etching step is performed after a photolithography process, a mask formed in the photolithography process is removed.

Embodiment 1

In this embodiment, a semiconductor device which is one embodiment of the present invention and a manufacturing method thereof are described with reference to drawings.

Figure 1C:
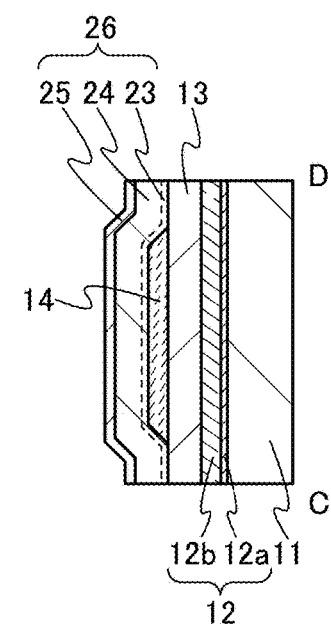
Figure 1B:
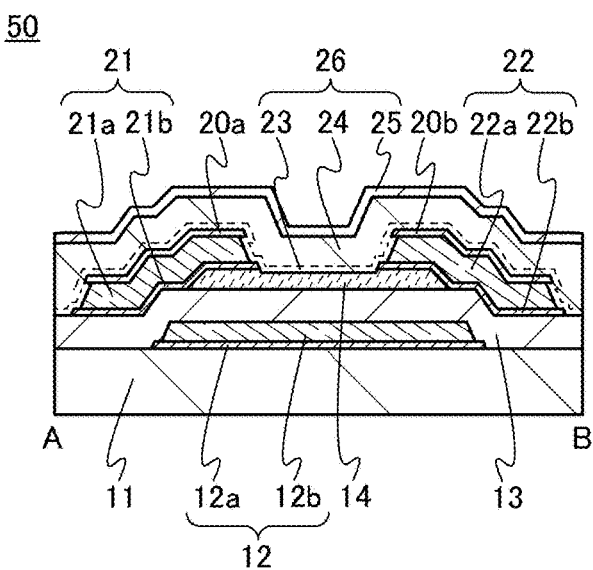

FIGS. 1A to 1C are a top view and cross-sectional views of a transistor 50 of a semiconductor device. The transistor 50 shown in FIGS. 1A to 1C is a channel-etched transistor. FIG. 1A is a top view of the transistor 50, FIG. 1B is a cross-sectional view taken along dashed-dotted line A-B in FIG. 1A, and FIG. 1C is a cross-sectional view taken along dashed-dotted line C-D in FIG. 1A. Note that in FIG. 1A, a substrate 11, a gate insulating film 13, an oxide insulating film 23, an oxide insulating film 24, a nitride insulating film 25, and the like are not illustrated for clarity.

The transistor 50 illustrated in FIGS. 1B and 1C includes a gate electrode 12 provided over the substrate 11, the gate insulating film 13 formed over the substrate 11 and the gate electrode 12, a semiconductor film 14 overlapping with the gate electrode 12 with the gate insulating film 13 provided therebetween, and a pair of electrodes 21 and 22 in contact with the semiconductor film 14.

The pair of electrodes 21 and 22 functions as a source electrode and a drain electrode. Of the pair of electrodes 21 and 22, the electrode 21 includes at least a first protective film 21b and a conductive film 21a, and the electrode 22 includes at least a first protective film 22b and a conductive film 22a. The first protective films 21b and 22b are both in contact with the semiconductor film 14. In addition, second protective films 20a and 20b are formed over the conductive films 21a and 22a, respectively.

The first protective films 21b and 22b have a function of preventing a metal element contained in the conductive films 21a and 22a from diffusing into the semiconductor film 14.

The first protective films 21*b* and 22*b* are formed using titanium, tantalum, molybdenum, an alloy of titanium, an alloy of tantalum, an alloy of molybdenum, titanium nitride, tantalum nitride, molybdenum nitride, or the like as appropriate.

The conductive films 21*a* and 22*a* have a single-layer structure or a stacked-layer structure formed using a low-resistance material such as copper, aluminum, gold, silver, or molybdenum, an alloy of any of these materials, or a compound containing any of these materials as a main component. For example, a single-layer structure of an aluminum film containing silicon, a two-layer structure in which a titanium film is stacked over an aluminum film, a two-layer structure in which a copper film, a silver film, or a gold film is stacked over a copper-magnesium-aluminum alloy film, a two-layer structure in which a titanium film or a titanium nitride film is formed over an aluminum film, a copper film, a silver film, or a gold film, a three-layer structure in which an aluminum film, a copper film, a silver film, or a gold film is stacked over a molybdenum film or a molybdenum nitride film and a molybdenum film or a molybdenum nitride film is stacked thereover, and the like can be given.

The pair of electrodes 21 and 22 serves also as wirings. Therefore, when the conductive films included in the pair of electrodes 21 and 22 are formed using a low-resistance material such as copper, aluminum, gold, silver, or molybdenum, a semiconductor device with reduced wiring delay can be manufactured using a large-sized substrate. Furthermore, a semiconductor device with reduced power consumption can be manufactured.

The second protective films 20*a* and 20*b* are formed over the pair of electrodes 21 and 22. In addition, an insulating film 26 is formed over the gate insulating film 13, the semiconductor film 14, the pair of electrodes 21 and 22, and the second protective films 20*a* and 20*b*.

The second protective films 20*a* and 20*b* serve as etching protective films in the processing step for forming the first protective films and/or the conductive films 21*a* and 22*a*. In addition, the second protective films 20*a* and 20*b* have a function of preventing the conductive films 21*a* and 22*a* from being exposed to plasma, typically oxygen plasma. Furthermore, the second protective films 20*a* and 20*b* have a function of preventing diffusion of the metal element contained in the conductive films 21*a* and 22*a*. For these functions, the second protective films 20*a* and 20*b* are formed using a material which has etching resistance when the conductive films 21*a* and 22*a* are formed by etching. In addition, the second protective films 20*a* and 20*b* are formed using a material which has plasma resistance. Furthermore, the second protective films 20*a* and 20*b* are formed using a material which prevents diffusion of the metal element contained in the conductive films 21*a* and 22*a*.

The second protective films 20*a* and 20*b* are formed using a nitride insulating film containing silicon nitride, silicon nitride oxide, aluminum nitride, aluminum nitride oxide, or the like, as appropriate. Note that in this specification, the silicon nitride oxide film and the aluminum nitride oxide film have a high nitrogen content compared with an oxygen content (in atomic ratio), and the silicon oxynitride film and the aluminum oxynitride film have a high oxygen content compared with a nitrogen content (in atomic ratio).

Alternatively, the second protective films 20*a* and 20*b* are formed using a light-transmitting conductive film of indium tin oxide (hereinafter also referred to as ITO), indium oxide containing tungsten oxide, indium zinc oxide containing tungsten oxide, indium oxide containing titanium oxide, indium tin oxide containing titanium oxide, indium zinc oxide, indium tin oxide containing silicon oxide, or the like.

Alternatively, the second protective films 20*a* and 20*b* are formed using as appropriate an oxide semiconductor or an oxide containing In, Ga, or Zn which can be used for the semiconductor film 14 and an oxide film 15 described later.

Note that the electrode 21 of the pair of electrodes 21 and 22 includes at least the conductive film 21*a* and the first protective film 21*b*. The electrode 22 includes at least the conductive film 22*a* and the first protective film 22*b*. Note that in the case where the second protective films 20*a* and 20*b* are formed using a light-transmitting conductive film, the second protective films 20*a* and 20*b* serve as parts of the electrodes 21 and 22, respectively.

In the cross-sectional view illustrated in FIG. 1B, side surfaces of the second protective films 20*a* and 20*b* are located on the outer side of side surfaces of the conductive films 21*a* and 22*a*. In other words, upper surfaces of the conductive films 21*a* and 22*a* are covered with the second protective films 20*a* and 20*b*, and the second protective films 20*a* and 20*b* extend outward beyond the side surfaces of the conductive films 21*a* and 22*a*. Therefore, in the case where the first protective films 21*b* and 22*b* are formed using the second protective films 20*a* and 20*b* as a mask, the side surfaces of the conductive films 21*a* and 22*a* are unlikely to be exposed to plasma.

A mask formed of an organic resin (typically, a mask formed of a resist) used for formation of the second protective films 20*a* and 20*b*, the conductive films 21*a* and 22*a*, and the first protective films 21*b* and 22*b* is removed by ashing treatment in which the mask is decomposed in a gas phase by oxygen plasma. Alternatively, the mask formed of the organic resin can be removed using a stripper after the ashing treatment because the ashing treatment facilitates mask removal using the stripper.

In the case where an oxide insulating film as a protective film is formed over the conductive films 21*a* and 22*a* by a sputtering method, a CVD method, or the like, the conductive films 21*a* and 22*a* are exposed to oxygen plasma.

When the conductive films 21*a* and 22*a* are exposed to oxygen plasma, the metal element included in the conductive films reacts with oxygen to form a metal oxide. There is a problem in that the metal oxide is diffused into the semiconductor film 14 because of its high reactivity. On the other hand, when the second protective films 20*a* and 20*b* are provided over the conductive films 21*a* and 22*a* as illustrated in FIG. 1B, the second protective films 20*a* and 20*b* function as masks and side surfaces of the conductive films 21*a* and 22*a* are not easily exposed to oxygen plasma. As a result, metal oxide in which oxygen and the metal element contained in the conductive films are reacted with each other is not easily formed and the movement of the metal element contained in the conductive films to the semiconductor film 14 can be inhibited.

Accordingly, the concentration of impurities in the semiconductor film 14 can be reduced. Further, variation in electrical characteristics of the transistor 50 including the semiconductor film 14 can be reduced.

Other details of the transistor 50 are described below.

There is no particular limitation on a material and the like of the substrate 11 as long as the material has heat resistance high enough to withstand at least heat treatment performed later. For example, a glass substrate, a ceramic substrate, a quartz substrate, or a sapphire substrate may be used as the substrate 11. Alternatively, a single crystal semiconductor substrate or a polycrystalline semiconductor substrate made of silicon, silicon carbide, or the like, a compound semiconductor substrate made of silicon germanium or the like, an SOI substrate, or the like may be used. Still alternatively, any of these substrates provided with a semiconductor element may be used as the substrate 11. In the case where a glass substrate is used as the substrate 11, a glass substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

Alternatively, a flexible substrate may be used as the substrate 11, and the transistor 50 may be provided directly on the flexible substrate. Alternatively, a separation layer may be provided between the substrate 11 and the transistor 50. The separation layer can be used when part or the whole of a semiconductor device formed over the separation layer is completed and separated from the substrate 11 and transferred to another substrate. In such a case, the transistor 50 can be transferred to a substrate having low heat resistance or a flexible substrate as well.

As the gate electrode 12, a protective film 12a and a conductive film 12b are stacked. The protective film 12a can be formed using a material similar to that of the first protective films 21b and 22b, as appropriate. The conductive film 12b can be formed using a material similar to that of the conductive films 21a and 22a, as appropriate. When the protective film 12a is provided, the adhesion between the substrate 11 and the conductive film 12b can be increased.

The conductive film 12b can be formed using a light-transmitting conductive material such as indium tin oxide, indium oxide containing tungsten oxide, indium zinc oxide containing tungsten oxide, indium oxide containing titanium oxide, indium tin oxide containing titanium oxide, indium zinc oxide, or indium tin oxide containing silicon oxide. It is also possible to employ a stacked-layer structure formed using the above light-transmitting conductive material and the above metal element.

Note that although the protective film 12a is provided here as part of the gate electrode 12, only the protective film 12b may be provided as the gate electrode 12.

The gate insulating film 13 can be formed to have a single-layer structure or a stacked-layer structure using, for example, any of silicon oxide, silicon oxynitride, silicon nitride oxide, silicon nitride, aluminum oxide, aluminum oxynitride, aluminum nitride, aluminum nitride oxide, hafnium oxide, gallium oxide, Ga—Zn-based metal oxide, and the like.

Note that in the gate insulating film 13, a nitride insulating film containing silicon nitride, silicon nitride oxide, aluminum nitride, aluminum nitride oxide, or the like is preferably formed as a film in contact with the gate electrode 12, in which case diffusion of the metal element contained in the conductive film 12b of the gate electrode 12 can be prevented.

The gate insulating film 13 may be formed using a high-k material such as hafnium silicate ($HfSiO_x$), hafnium silicate to which nitrogen is added ($HfSi_xO_yN_z$), hafnium aluminate to which nitrogen is added ($HfAl_xO_yN_z$), hafnium oxide, or yttrium oxide, so that gate leakage current of the transistor can be reduced.

The thickness of the gate insulating film 13 is greater than or equal to 5 nm and less than or equal to 400 nm, preferably greater than or equal to 10 nm and less than or equal to 300 nm, more preferably greater than or equal to 50 nm and less than or equal to 250 nm.

The semiconductor film 14 can be formed using a semiconductor element such as silicon, germanium, gallium arsenide, or gallium nitride as appropriate. The semiconductor film 14 can have a single crystal structure or a non-single-crystal structure as appropriate. Non-single-crystal structures include a polycrystalline structure, a microcrystalline structure, and an amorphous structure, for example.

In the case where a semiconductor element such as silicon, germanium, gallium arsenide, or gallium nitride is used for the semiconductor film 14, the thickness of the semiconductor film 14 is set to greater than or equal to 20 nm and less than or equal to 500 nm, preferably greater than or equal to 50 nm and less than or equal to 200 nm, more preferably greater than or equal to 70 nm and less than or equal to 150 nm.

Alternatively, the semiconductor film 14 can be formed using an oxide semiconductor containing In, Ga, or Zn. Typical examples of the oxide semiconductor containing In, Ga, or Zn include an In—Ga oxide, an In—Zn oxide, and an In-M-Zn oxide (M represents Ti, Ga, Y, Zr, La, Ce, Nd, or Hf).

In the case where the oxide semiconductor is an In-M-Zn oxide (M represents Ti, Ga, Y, Zr, La, Ce, Nd, or Hf), the atomic ratio of metal elements of a sputtering target used for depositing the In-M-Zn oxide preferably satisfies In≥M and Zn≥M. As the atomic ratio of metal elements of such a sputtering target, In:M:Zn=1:1:1 and In:M:Zn=3:1:2 are preferable. Note that the atomic ratios of metal elements in the oxide semiconductor film formed vary from those in the above-described sputtering target, within a range of ±30% as an error.

In the case where the oxide semiconductor is an In-M-Zn oxide, the proportions of In and M when summation of In and M is assumed to be 100 atomic % are preferably as follows: the atomic percentage of In is greater than or equal to 25 atomic % and the atomic percentage of M is less than 75 atomic %, or more preferably, the atomic percentage of In is greater than or equal to 34 atomic % and the atomic percentage of M is less than 66 atomic %.

The energy gap of the oxide semiconductor is 2 eV or more, preferably 2.5 eV or more, or more preferably 3 eV or more. With the use of an oxide semiconductor having such a wide energy gap for the semiconductor film 14, the off-state current of the transistor 50 can be reduced.

The oxide semiconductor can have a single crystal structure or a non-single-crystal structure as appropriate. Non-single-crystal structures include a c-axis aligned crystalline oxide semiconductor (CAAC-OS) described later, a polycrystalline structure, a microcrystalline structure described later, and an amorphous structure. Among the non-single-crystal structures, the amorphous structure has the highest density of defect states, whereas CAAC-OS has the lowest density of defect states.

In the case where an oxide semiconductor is used for the semiconductor film 14, the thickness of the semiconductor film 14 is set to greater than or equal to 3 nm and less than or equal to 200 nm, preferably greater than or equal to 3 nm and less than or equal to 100 nm, more preferably greater than or equal to 3 nm and less than or equal to 50 nm.

Note that it is preferable to use, as the oxide semiconductor, an oxide semiconductor in which the impurity concentration is low and the density of defect states is low, in which case the transistor can have more excellent electrical characteristics. The state in which the impurity concentration is low and the density of defect states is low (the number of oxygen vacancies is small) is referred to as a "highly purified intrinsic" or "substantially highly purified intrinsic" state.

A highly purified intrinsic or substantially highly purified intrinsic oxide semiconductor has few carrier generation sources, and thus can have a low carrier density in some cases. Thus, a transistor in which a channel region is formed in the semiconductor film 14 including the oxide semiconductor rarely has negative threshold voltage (is rarely normally on).

The oxide semiconductor preferably has a carrier density of $1\times10^{17}/cm^3$ or less, more preferably $1\times10^{15}/cm^3$ or less, still more preferably $1\times10^{13}/cm^3$ or less, yet more preferably $1\times10^{11}/cm^3$ or less.

Further, a highly purified intrinsic or substantially highly purified intrinsic oxide semiconductor has a low density of defect states and thus has low density of trap states in some cases.

Further, a transistor including a highly purified intrinsic or substantially highly purified intrinsic oxide semiconductor has an extremely low off-state current; even when an element has a channel width of $1\times10^6$ µm and a channel length (L) of 10 µm, the off-state current can be less than or equal to the measurement limit of a semiconductor parameter analyzer, i.e., less than or equal to $1\times10^{-13}$ A, at a voltage (drain voltage) between a source electrode and a drain electrode of from 1 V to 10 V.

Thus, the transistor in which a channel region is formed in the oxide semiconductor has a small variation in electrical characteristics and high reliability in some cases. Electric charges trapped by the carrier traps in the oxide semiconductor take a long time to be lost, and might behave like fixed electric charges. Thus, the transistor in which a channel region is formed in the oxide semiconductor having a high density of defect states has unstable electrical characteristics in some cases. Examples of the impurities include hydrogen, nitrogen, alkali metal, alkaline earth metal, and the like.

Hydrogen contained in the oxide semiconductor reacts with oxygen bonded to a metal atom to form water, and in addition, an oxygen vacancy is formed in a lattice from which oxygen is released (or in a portion from which oxygen is released). Due to entry of hydrogen into the oxygen vacancy, an electron serving as a carrier is generated in some cases. Further, in some cases, bonding of part of hydrogen to oxygen bonded to a metal element causes generation of an electron serving as a carrier. Thus, a transistor including an oxide semiconductor which contains hydrogen is likely to be normally on.

Accordingly, it is preferable that hydrogen be reduced as much as possible in the oxide semiconductor. Specifically, the hydrogen concentration of the oxide semiconductor, which is measured by secondary ion mass spectrometry (SIMS), is lower than or equal to $5\times10^{19}$ atoms/cm³, preferably lower than or equal to $1\times10^{19}$ atoms/cm³, more preferably lower than or equal to $5\times10^{18}$ atoms/cm³, still more preferably lower than or equal to $1\times10^{18}$ atoms/cm³, yet more preferably lower than or equal to $5\times10^{17}$ atoms/cm³, or even more preferably lower than or equal to $1\times10^{16}$ atoms/cm³.

When silicon or carbon which is one of elements belonging to Group 14 is contained in the oxide semiconductor, oxygen vacancies are increased, and the oxide semiconductor becomes n-type. Thus, the concentration of silicon or carbon of the oxide semiconductor is lower than or equal to $2\times10^{18}$ atoms/cm³, preferably lower than or equal to $2\times10^{17}$ atoms/cm³.

Further, the concentration of alkali metal or alkaline earth metal of the oxide semiconductor, which is measured by SIMS, is lower than or equal to $1\times10^{18}$ atoms/cm³, preferably lower than or equal to $2\times10^{16}$ atoms/cm³. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor.

Further, when containing nitrogen, the oxide semiconductor easily has n-type conductivity by generation of electrons serving as carriers and an increase of carrier density. Thus, a transistor including an oxide semiconductor which contains nitrogen is likely to be normally on. For this reason, nitrogen in the oxide semiconductor is preferably reduced as much as possible; the concentration of nitrogen which is measured by SIMS is preferably set to, for example, lower than or equal to $5\times10^{18}$ atoms/cm³.

In the semiconductor film 14, the concentration of copper, aluminum, gold, silver, or molybdenum is less than or equal to $1\times10^{18}$ atoms/cm³. When the concentration of copper, aluminum, gold, silver, or molybdenum in the semiconductor film 14 is set to the above concentration, the electrical characteristics of the transistor can be improved. In addition, the reliability of the transistor can be improved.

Note that when a conductive material which is easily bonded to oxygen, such as titanium, tantalum, molybdenum, or an alloy thereof, is used for the first protective films 21b and 22b, oxygen contained in the oxide semiconductor and the conductive material contained in the first protective films 21b and 22b are bonded to each other, so that an oxygen deficient region is formed in the semiconductor film 14 including the oxide semiconductor. Further, in some cases, part of constituent elements of the conductive material that forms the first protective films 21b and 22b is mixed into the semiconductor film 14 including the oxide semiconductor. Consequently, low-resistance regions are formed in the vicinity of regions of the semiconductor film 14 including the oxide semiconductor which are in contact with the first protective films 21b and 22b. The low-resistance regions are formed between the gate insulating film 13 and the first protective films 21b and 22b so as to be in contact with the first protective films 21b and 22b. Since the low-resistance regions have high conductivity, contact resistance between the semiconductor film 14 including the oxide semiconductor and the first protective films 21b and 22b can be reduced, and thus, the on-state current of the transistor can be increased.

For the insulating film 26, an oxide insulating film or a nitride insulating film can be used as appropriate.

Here, in the case where an oxide semiconductor is used for the semiconductor film 14, the oxide insulating film 23 and the oxide insulating film 24 which can reduce oxygen vacancies in the oxide semiconductor and the nitride insulating film 25 which can prevent impurities from moving to the semiconductor film 14 from the outside are used as the insulating film 26. Details of the oxide insulating film 23, the oxide insulating film 24, and the nitride insulating film 25 are described below.

The oxide insulating film 23 is an oxide insulating film which is permeable to oxygen. Note that the oxide insulating film 23 serves also as a film which relieves damage to the semiconductor film 14 at the time of forming the oxide insulating film 24 later.

A silicon oxide film, a silicon oxynitride film, or the like with a thickness greater than or equal to 5 nm and less than or equal to 150 nm, preferably greater than or equal to 5 nm and less than or equal to 50 nm can be used as the oxide insulating film 23.

Further, it is preferable that the amount of defects in the oxide insulating film 23 be small, and typically the spin density corresponding to a signal which appears at g=2.001 due to a dangling bond of silicon, be lower than or equal to $3 \times 10^{17}$ spins/cm$^3$ by ESR measurement. This is because if the density of defects in the oxide insulating film 23 is high, oxygen is bonded to the defects and the amount of oxygen that permeates the oxide insulating film 23 is decreased.

Further, it is preferable that the amount of defects at the interface between the oxide insulating film 23 and the semiconductor film 14 be small, and typically the spin density corresponding to a signal which appears at g=1.93 due to a defect in the semiconductor film 14 be lower than or equal to $1 \times 10^{17}$ spins/cm$^3$, more preferably lower than or equal to the lower limit of detection by ESR measurement.

Note that in the oxide insulating film 23, all oxygen having entered the oxide insulating film 23 from the outside does not move to the outside of the oxide insulating film 23 and some oxygen remains in the oxide insulating film 23. Further, movement of oxygen occurs in the oxide insulating film 23 in some cases in such a manner that oxygen enters the oxide insulating film 23 and oxygen contained in the oxide insulating film 23 is moved to the outside of the oxide insulating film 23.

When the oxide insulating film which is permeable to oxygen is formed as the oxide insulating film 23, oxygen released from the oxide insulating film 24 provided over the oxide insulating film 23 can be moved to the semiconductor film 14 through the oxide insulating film 23.

The oxide insulating film 24 is formed in contact with the oxide insulating film 23. The oxide insulating film 24 is formed using an oxide insulating film which contains oxygen at a higher proportion than the stoichiometric composition. Part of oxygen is released by heating from the oxide insulating film which contains oxygen at a higher proportion than the stoichiometric composition. The oxide insulating film containing oxygen at a higher proportion than the stoichiometric composition is an oxide insulating film of which the amount of released oxygen converted into oxygen atoms is greater than or equal to $1.0 \times 10^{18}$ atoms/cm$^3$, preferably greater than or equal to $3.0 \times 10^{20}$ atoms/cm$^3$ in TDS analysis.

A silicon oxide film, a silicon oxynitride film, or the like with a thickness greater than or equal to 30 nm and less than or equal to 500 nm, preferably greater than or equal to 50 nm and less than or equal to 400 nm can be used as the oxide insulating film 24.

Further, it is preferable that the amount of defects in the oxide insulating film 24 be small, and typically the spin density corresponding to a signal which appears at g=2.001 due to a dangling bond of silicon, be lower than $1.5 \times 10^{18}$ spins/cm$^3$, more preferably lower than or equal to $1 \times 10^{18}$ spins/cm$^3$ by ESR measurement. Note that the oxide insulating film 24 is provided more apart from the semiconductor film 14 than the oxide insulating film 23 is; thus, the oxide insulating film 24 may have higher defect density than the oxide insulating film 23.

Further, it is possible to prevent outward diffusion of oxygen from the semiconductor film 14 and entry of hydrogen, water, or the like into the semiconductor film 14 from the outside by providing the nitride insulating film 25 having a blocking effect against oxygen, hydrogen, water, alkali metal, alkaline earth metal, and the like over the oxide insulating film 24. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. The oxide insulating film having a blocking effect against oxygen, hydrogen, water, and the like is formed using aluminum oxide, aluminum oxynitride, gallium oxide, gallium oxynitride, yttrium oxide, yttrium oxynitride, hafnium oxide, hafnium oxynitride, or the like.

Next, a method for manufacturing the transistor 50 illustrated in FIGS. 1A to 1C is described with reference to FIGS. 2A to 2D and FIGS. 3A to 3D.

Figure 2A:
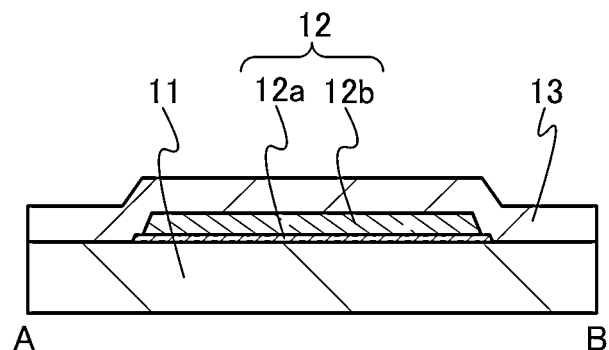
FIGS. 2A to 2D are cross-sectional views illustrating one embodiment of a method for manufacturing a transistor.

As illustrated in FIG. 2A, the gate electrode 12 is formed over the substrate 11, and the gate insulating film 13 is formed over the gate electrode 12.

Here, a glass substrate is used as the substrate 11.

A method for forming the gate electrode 12 is described below. First, a film to be a protective film and a conductive film are formed by a sputtering method, a CVD method, an evaporation method, or the like. Then, a mask is formed over the conductive film by a photolithography process. Next, part of the film to be the protective film and part of the conductive film are etched with the use of the mask to form the gate electrode 12 including the protective film 12a and the conductive film 12b. After that, the mask is removed.

Note that the gate electrode 12 may be formed by an electrolytic plating method, a printing method, an inkjet method, or the like instead of the above formation method.

Here, a 35-nm-thick tantalum film and a 200-nm-thick copper film are formed in this order by a sputtering method. Next, a mask is formed by a photolithography process, and part of the copper film is subjected to dry etching and part of the titanium film is subjected to dry etching with the use of the mask to form the protective film 12a of the titanium film and the conductive film 12b.

The gate insulating film 13 is formed by a sputtering method, a CVD method, an evaporation method, or the like.

In the case where a silicon oxide film, a silicon oxynitride film, or a silicon nitride oxide film is formed as the gate insulating film 13, a deposition gas containing silicon and an oxidizing gas are preferably used as a source gas. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

Moreover, in the case of forming a gallium oxide film as the gate insulating film 13, a metal organic chemical vapor deposition (MOCVD) method can be employed.

Figure 2B:
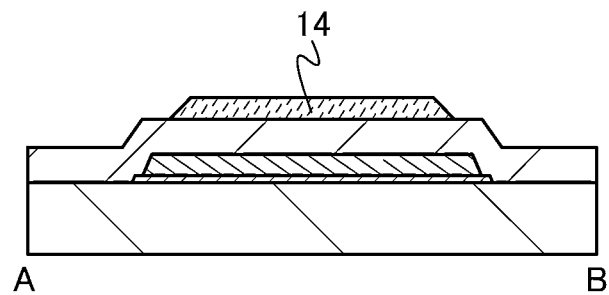

Next, as illustrated in FIG. 2B, the semiconductor film 14 is formed over the gate insulating film 13.

A method for forming the semiconductor film 14 is described below. A semiconductor film to be the semiconductor film 14 is formed over the gate insulating film 13. Then, after a mask is formed over the semiconductor film by a photolithography process, part of the semiconductor film is etched using the mask. Thus, the semiconductor film subjected to element isolation is formed as illustrated in FIG. 2B. After that, the mask is removed.

The semiconductor film to be the semiconductor film 14 can be formed by a sputtering method, a coating method, a pulsed laser deposition method, a laser ablation method, a CVD method, or the like.

Note that in the case where an oxide semiconductor film is formed as the semiconductor film 14, a power supply device for generating plasma in a sputtering method can be an RF power supply device, an AC power supply device, a DC power supply device, or the like as appropriate.

As a sputtering gas, a rare gas (typically argon), an oxygen gas, or a mixed gas of a rare gas and oxygen is used as appropriate. In the case of using the mixed gas of a rare gas and oxygen, the proportion of oxygen to a rare gas is preferably increased.

Further, a target may be appropriately selected in accordance with the composition of the oxide semiconductor film to be formed.

In order to obtain a highly purified intrinsic or substantially highly purified intrinsic oxide semiconductor film, it is necessary to highly purify a sputtering gas as well as to evacuate a chamber to a high vacuum. As an oxygen gas or an argon gas used for a sputtering gas, a gas which is highly purified to have a dew point of −40° C. or lower, −80° C. or lower, −100° C. or lower, or −120° C. or lower is used, whereby entry of moisture or the like into the oxide semiconductor film can be minimized.

Here, a 35-nm-thick In—Ga—Zn oxide film is formed as the oxide semiconductor film by a sputtering method using an In—Ga—Zn oxide target (In:Ga:Zn=1:1:1). Next, a mask is formed over the oxide semiconductor film, and part of the oxide semiconductor film is selectively etched. Thus, the semiconductor film 14 is formed.

Then, first heat treatment may be performed. In the case where the oxide semiconductor film is formed as the semiconductor film 14, the first heat treatment can reduce the concentrations of hydrogen and water contained in the oxide semiconductor film by releasing hydrogen, water, and the like from the semiconductor film 14. The heat treatment is performed typically at a temperature of higher than or equal to 300° C. and lower than or equal to 400° C., preferably higher than or equal to 320° C. and lower than or equal to 370° C.

An electric furnace, an RTA apparatus, or the like can be used for the first heat treatment. With the use of an RTA apparatus, the heat treatment can be performed at a temperature of higher than or equal to the strain point of the substrate if the heating time is short. Therefore, the heat treatment time can be shortened.

The first heat treatment may be performed under an atmosphere of nitrogen, oxygen, ultra-dry air (air with a water content of 20 ppm or less, preferably 1 ppm or less, more preferably 10 ppb or less), or a rare gas (argon, helium, or the like). The atmosphere of nitrogen, oxygen, ultra-dry air, or a rare gas preferably does not contain hydrogen, water, and the like. Further, after heat treatment performed in a nitrogen atmosphere or a rare gas atmosphere, heat treatment may be additionally performed in an oxygen atmosphere or an ultra-dry air atmosphere. As a result, hydrogen, water, and the like can be released from the semiconductor film 14 and oxygen can be supplied to the semiconductor film 14 at the same time. Consequently, the amount of oxygen vacancies in the semiconductor film 14 can be reduced.

Figure 2C:
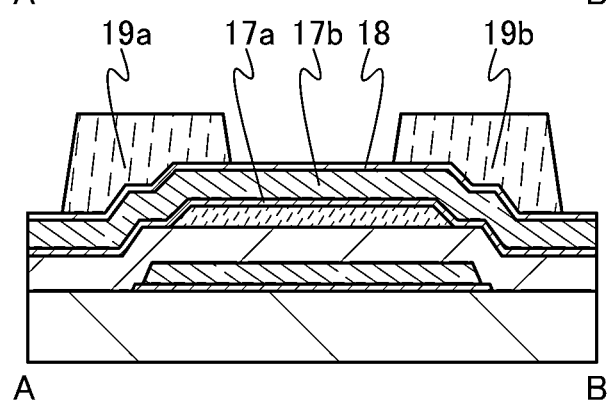

Next, as illustrated in FIG. 2C, a film 17a to be the first protective films, a conductive film 17b, and a film 18 to be the second protective films are formed in this order. Then, masks 19a and 19b are formed over the film 18 to be the second protective films.

The film 17a to be the first protective films, the conductive film 17b, and the film 18 to be the second protective films are formed by a sputtering method, a CVD method, an evaporation method, or the like.

Here, a 35-nm-thick titanium film is formed by a sputtering method as the film 17a to be the first protective films.

A 200-nm-thick copper film is formed by a sputtering method as the conductive film 17b. A 200-nm-thick silicon nitride film is formed by a plasma CVD method as the film 18 to be the second protective films. The masks 19a and 19b are formed by a photolithography process.

Figure 2D:
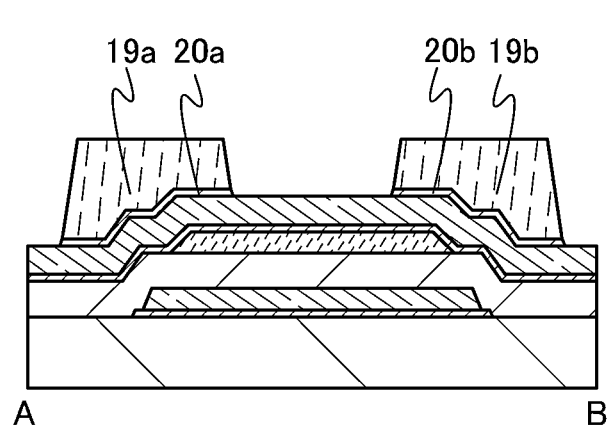

Next, as illustrated in FIG. 2D, part of the film 18 to be the second protective films is etched using the masks 19a and 19b to form the pair of second protective films 20a and 20b. The film 18 to be the second protective films can be etched by dry etching, wet etching, or the like as appropriate. Note that the second protective films 20a and 20b serve as hard masks in a later step, and the distance between the second protective films 20a and 20b corresponds to the channel length. Therefore, the film 18 to be the second protective films is preferably etched by dry etching by which anisotropic etching can be performed.

Figure 3A:
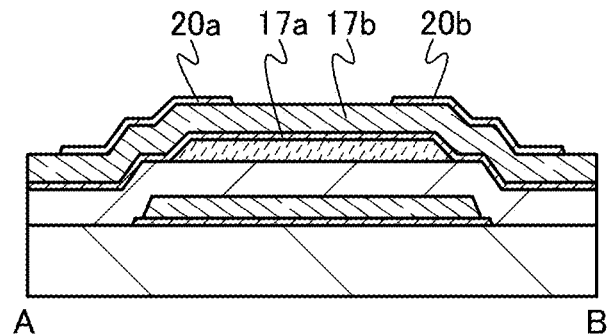
FIGS. 3A to 3D are cross-sectional views illustrating one embodiment of a method for manufacturing a transistor.

Next, the masks 19a and 19b are removed as illustrated in FIG. 3A. Here, the masks 19a and 19b are subjected to ashing treatment for ease of removal, and then the masks 19a and 19b are removed using a stripper.

Note that in the step of removing the masks 19a and 19b, the conductive film 17b is exposed, whereas the semiconductor film 14 is covered with the film 17a to be the first protective films and is not exposed. Thus, the metal element contained in the conductive film 17b does not move to the semiconductor film 14.

Figure 3B:
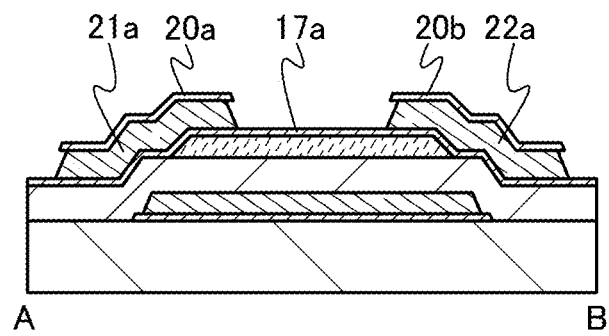

Next, as illustrated in FIG. 3B, part of the conductive film 17b is etched using the second protective films 20a and 20b to form the pair of conductive films 21a and 22a. Here, conditions are determined such that the film 17a to be the first protective films is not etched and the conductive film 17b is selectively etched. Consequently, the semiconductor film 14 is not exposed in this etching step; thus, the metal element contained in the conductive film 17b does not move to the semiconductor film 14 during etching of the conductive film 17b. In addition, the conductive film 17b is isotropically etched by a wet etching method; thus, the conductive films 21a and 22a are formed such that the side surfaces thereof are located on the inner side of the side surfaces of the second protective films 20a and 20b. For the etching conditions in which the film 17a to be the first protective films is not etched and the conductive film 17b is selectively etched, acetic acid, perchloric acid, a mixed solution of phosphoric acid, acetic acid, and nitric acid (an aluminum etchant), or the like can be used as appropriate.

Here, the conductive film 17b is selectively etched by a wet etching method using a mixed solution of hydrogen peroxide, ammonium acetate, malonic acid, ethylenediaminetetraacetic acid, and 5-amino-1H-tetrazole monohydrate as an etchant.

Figure 3C:
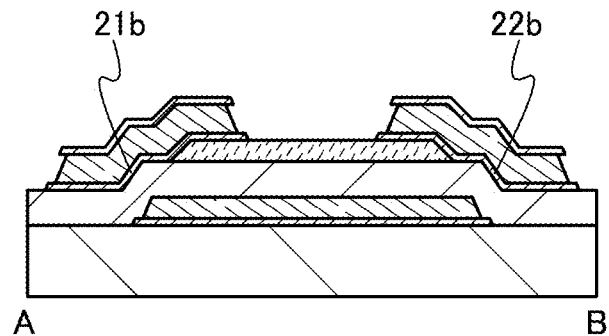

Next, as illustrated in FIG. 3C, part of the film 17a to be the first protective films is etched using the second protective films 20a and 20b to form the pair of first protective films 21b and 22b. The film 17a to be the first protective films can be etched by dry etching, wet etching, or the like as appropriate.

Here, the film 17a to be the first protective films is etched by a dry etching method using chlorine as an etching gas.

The side surfaces of the second protective films 20a and 20b are located on the outer side of the side surfaces of the conductive films 21a and 22a. In other words, the upper surfaces of the conductive films 21a and 22a are covered with the second protective films 20a and 20b, and the second protective films 20a and 20b extend outward beyond the side surfaces of the conductive films 21a and 22a. Therefore, when part of the film 17a to be the first protective films is etched, the side surfaces of the conductive films 21a and 22a are unlikely to be exposed to plasma. As a result, even when the semiconductor film 14 is exposed, movement of the metal element contained in the conductive films 21*a* and 22*a* to the semiconductor film 14 can be reduced.

Accordingly, the concentration of impurities in the semiconductor film 14 can be reduced.

Figure 3D:
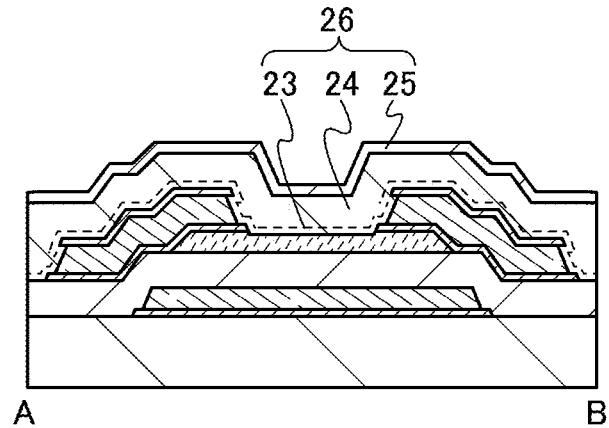

Next, as illustrated in FIG. 3D, the insulating film 26 is formed over the semiconductor film 14, the pair of electrodes 21 and 22, and the pair of second protective films 20*a* and 20*b*.

The insulating film 26 can be formed by a sputtering method, a CVD method, or the like as appropriate.

A method for forming the insulating film 26 by which, in the case where the semiconductor film 14 is an oxide semiconductor film, oxygen vacancies can be reduced in the oxide semiconductor film will be described below.

The oxide insulating film 23 is formed over the semiconductor film 14, the pair of electrodes 21 and 22, and the pair of the second protective films 20*a* and 20*b*. Next, the oxide insulating film 24 is formed over the oxide insulating film 23.

Note that after the oxide insulating film 23 is formed, the oxide insulating film 24 is preferably formed in succession without exposure to the air. After the oxide insulating film 23 is formed, the oxide insulating film 24 is formed in succession by adjusting at least one of the flow rate of a source gas, pressure, a high-frequency power, and a substrate temperature without exposure to the air, whereby the concentration of impurities attributed to the atmospheric component at the interface between the oxide insulating film 23 and the oxide insulating film 24 can be reduced and oxygen in the oxide insulating film 24 can be moved to the semiconductor film 14; accordingly, the amount of oxygen vacancies in the semiconductor film 14 can be reduced.

As the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 180° C. and lower than or equal to 400° C., preferably higher than or equal to 200° C. and lower than or equal to 370° C., the pressure in the treatment chamber is greater than or equal to 20 Pa and less than or equal to 250 Pa, preferably greater than or equal to 100 Pa and less than or equal to 250 Pa with introduction of a source gas into the treatment chamber, and a high-frequency power is supplied to an electrode provided in the treatment chamber.

A deposition gas containing silicon and an oxidizing gas are preferably used as the source gas of the oxide insulating film 23. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

With the use of the above conditions, an oxide insulating film which is permeable to oxygen can be formed as the oxide insulating film 23. Further, by providing the oxide insulating film 23, damage to the semiconductor film 14 can be reduced in a step of forming the oxide insulating film 24 later.

Note that as the oxide insulating film 23, a silicon oxide film or a silicon oxynitride film can be formed under the following conditions: the substrate placed in a treatment chamber of a plasma CVD apparatus that is vacuum-evacuated is held at a temperature higher than or equal to 200° C. and lower than or equal to 400° C., preferably higher than or equal to 220° C. and lower than or equal to 370° C., more preferably higher than or equal to 300° C. and lower than or equal to 400° C., still more preferably higher than or equal to 320° C. and lower than or equal to 370° C., the pressure in the treatment chamber is greater than or equal to 100 Pa and less than or equal to 250 Pa with introduction of a source gas into the treatment chamber, and a high-frequency power is supplied to an electrode provided in the treatment chamber.

Under these film formation conditions, the bonding strength of silicon and oxygen becomes strong when the substrate temperature is higher than or equal to 300° C. and lower than or equal to 400° C., preferably higher than or equal to 320° C. and lower than or equal to 370° C. Thus, as the oxide insulating film 23, a dense and hard oxide insulating film which is permeable to oxygen, typically, a silicon oxide film or a silicon oxynitride film of which etching using hydrofluoric acid of 0.5 wt % at 25° C. is performed at a rate of lower than or equal to 10 nm/min, preferably lower than or equal to 8 nm/min can be formed.

The oxide insulating film 23 is formed while heating is performed; thus, hydrogen, water, or the like contained in the semiconductor film 14 can be released in the step. Hydrogen contained in the semiconductor film 14 is bonded to an oxygen radical formed in plasma to form water. Since the substrate is heated in the step of forming the oxide insulating film 23, water formed by bonding of oxygen and hydrogen is released from the oxide semiconductor film. That is, when the oxide insulating film 23 is formed by a plasma CVD method, the amount of water and hydrogen contained in the oxide semiconductor film can be reduced.

Furthermore, by setting the pressure in the treatment chamber to be greater than or equal to 100 Pa and less than or equal to 250 Pa, the amount of water contained in the oxide insulating film 23 is reduced; thus, variation in electrical characteristics of the transistor 50 can be reduced and change in threshold voltage can be inhibited. Moreover, by setting the pressure in the treatment chamber to be greater than or equal to 100 Pa and less than or equal to 250 Pa, damage to the semiconductor film 14 can be reduced when the oxide insulating film 23 is formed, so that the amount of oxygen vacancies contained in the semiconductor film 14 can be reduced. In particular, when the film formation temperature of the oxide insulating film 23 or the oxide insulating film 24 which is formed later is set to be high, typically higher than 220° C., part of oxygen contained in the semiconductor film 14 is released and oxygen vacancies are easily formed. Further, when the film formation conditions for reducing the amount of defects in the oxide insulating film 24 which is formed later are used to increase reliability of the transistor, the amount of released oxygen is easily reduced. Thus, it is difficult to reduce oxygen vacancies in the semiconductor film 14 in some cases. However, by setting the pressure in the treatment chamber to be greater than or equal to 100 Pa and less than or equal to 250 Pa to reduce damage to the semiconductor film 14 at the time of forming the oxide insulating film 23, oxygen vacancies in the semiconductor film 14 can be reduced even when the amount of oxygen released from the oxide insulating film 24 is small.

Note that when the ratio of the amount of the oxidizing gas to the amount of the deposition gas containing silicon is 100 or higher, the hydrogen content in the oxide insulating film 23 can be reduced. Consequently, the amount of hydrogen entering the semiconductor film 14 can be reduced; thus, the negative shift in the threshold voltage of the transistor can be inhibited.

When the deposition rate of the oxide insulating film 23 is higher than or equal to 60 nm/min and lower than or equal to 200 nm/min, the oxide insulating film 23 can be formed with suppressed oxidation of the conductive films 21a and 22a. Consequently, the oxide insulating film 23 can be formed with increased stability of the conductive films 21a and 22a.

Here, as the oxide insulating film 23, a 50-nm-thick silicon oxynitride film is formed by a plasma CVD method in which silane with a flow rate of 30 sccm and dinitrogen monoxide with a flow rate of 4000 sccm are used as a source gas, the pressure in the treatment chamber is 200 Pa, the substrate temperature is 220° C., and a high-frequency power of 150 W is supplied to parallel-plate electrodes with the use of a 27.12 MHz high-frequency power source. Under the above conditions, a silicon oxynitride film which is permeable to oxygen can be formed. Note that although the method for forming the oxide insulating film 23 with a 27.12 MHz high-frequency power source is described in this embodiment as an example, the present invention is not limited to this example, and the oxide insulating film 23 may be formed with a 13.56 MHz high-frequency power source.

As the oxide insulating film 24, a silicon oxide film or a silicon oxynitride film is formed under the following conditions: the substrate placed in a treatment chamber of the plasma CVD apparatus that is vacuum-evacuated is held at a temperature higher than or equal to 180° C. and lower than or equal to 280° C., preferably higher than or equal to 200° C. and lower than or equal to 240° C., the pressure in the treatment chamber is greater than or equal to 100 Pa and less than or equal to 250 Pa, preferably greater than or equal to 100 Pa and less than or equal to 200 Pa with introduction of a source gas into the treatment chamber, and a high-frequency power of greater than or equal to 0.17 W/cm$^2$ and less than or equal to 0.5 W/cm$^2$, preferably greater than or equal to 0.25 W/cm$^2$ and less than or equal to 0.35 W/cm$^2$ is supplied to an electrode provided in the treatment chamber.

A deposition gas containing silicon and an oxidizing gas are preferably used as the source gas of the oxide insulating film 24. Typical examples of the deposition gas containing silicon include silane, disilane, trisilane, and silane fluoride. As the oxidizing gas, oxygen, ozone, dinitrogen monoxide, nitrogen dioxide, and the like can be given as examples.

As the film formation conditions for the oxide insulating film 24, the high-frequency power having the above power density is supplied to the treatment chamber having the above pressure, whereby the decomposition efficiency of the source gas in plasma is increased, oxygen radicals are increased, and oxidation of the source gas is promoted; therefore, the oxygen content in the oxide insulating film 24 becomes higher than that in the stoichiometric composition. On the other hand, in the film formed at a substrate temperature within the above temperature range, the bond between silicon and oxygen is weak, and accordingly, part of oxygen in the film is released by heat treatment in the later step. Thus, it is possible to form an oxide insulating film which contains oxygen at a higher proportion than the stoichiometric composition and from which part of oxygen is released by heating. Further, the oxide insulating film 23 is provided over the semiconductor film 14. Accordingly, in the step of forming the oxide insulating film 24, the oxide insulating film 23 serves as a protective film for the semiconductor film 14. Consequently, the oxide insulating film 24 can be formed using the high-frequency power having a high power density while damage to the semiconductor film 14 is reduced.

Note that in the film formation conditions for the oxide insulating film 24, the flow rate of the deposition gas containing silicon relative to the oxidizing gas can be increased, whereby the amount of defects in the oxide insulating film 24 can be reduced. Typically, it is possible to form an oxide insulating film in which the amount of defects is small, i.e., the spin density corresponding to a signal which appears at g=2.001 due to a dangling bond of silicon is lower than $6\times10^{17}$ spins/cm$^3$, preferably lower than or equal to $3\times10^{17}$ spins/cm$^3$, more preferably lower than or equal to $1.5\times10^{17}$ spins/cm$^3$ by ESR measurement. As a result, the reliability of the transistor can be improved.

Here, as the oxide insulating film 24, a 400-nm-thick silicon oxynitride film is formed by a plasma CVD method in which silane with a flow rate of 200 sccm and dinitrogen monoxide with a flow rate of 4000 sccm are used as the source gas, the pressure in the treatment chamber is 200 Pa, the substrate temperature is 220° C., and a high-frequency power of 1500 W is supplied to the parallel-plate electrodes with the use of a 27.12 MHz high-frequency power source. Note that a plasma CVD apparatus used here is a parallel-plate plasma CVD apparatus in which the electrode area is 6000 cm$^2$, and the power per unit area (power density) into which the supplied power is converted is 0.25 W/cm$^2$. Note that although the method for forming the oxide insulating film 24 with a 27.12 MHz high-frequency power source is described in this embodiment as an example, the present invention is not limited to this example, and the oxide insulating film 24 may be formed with a 13.56 MHz high-frequency power source.

Next, heat treatment may be performed. The heat treatment is performed typically at a temperature of higher than or equal to 150° C. and lower than or equal to 300° C., preferably higher than or equal to 200° C. and lower than or equal to 250° C. The heat treatment can be performed in a manner similar to that of the first heat treatment.

By the heat treatment, part of oxygen contained in the oxide insulating film 24 can be moved to the semiconductor film 14, so that oxygen vacancies contained in the semiconductor film 14 can be reduced. Consequently, the amount of oxygen vacancies in the semiconductor film 14 can be reduced.

Further, in the case where water, hydrogen, or the like is contained in the oxide insulating film 23 and the oxide insulating film 24, when the nitride insulating film 25 having a function of blocking water, hydrogen, and the like is formed later and heat treatment is performed, water, hydrogen, or the like contained in the oxide insulating film 23 and the oxide insulating film 24 is moved to the semiconductor film 14, so that defects are generated in the semiconductor film 14. However, by the heating, water, hydrogen, or the like contained in the oxide insulating film 23 and the oxide insulating film 24 can be released; thus, variation in electrical characteristics of the transistor 50 can be reduced, and change in threshold voltage can be inhibited.

Note that when the oxide insulating film 24 is formed over the oxide insulating film 23 while being heated, oxygen can be moved to the semiconductor film 14 and oxygen vacancies in the semiconductor film 14 can be reduced; thus, the heat treatment is not necessarily performed.

Further, when the heat treatment is performed at a temperature higher than or equal to 150° C. and lower than or equal to 300° C., preferably higher than or equal to 200° C. and lower than or equal to 250° C., diffusion of copper, aluminum, gold, silver, molybdenum, or the like and entry of the element into the oxide semiconductor film can be inhibited.

Here, heat treatment is performed at 220° C. for one hour in an atmosphere of nitrogen and oxygen.

Further, when the pair of electrodes 21 and 22 is formed, the semiconductor film 14 is damaged by the etching of the conductive film, so that oxygen vacancies are generated on the back channel side of the semiconductor film 14 (the side of the semiconductor film 14 which is opposite the side facing the gate electrode 12). However, with the use of the oxide insulating film containing oxygen at a higher proportion than the stoichiometric composition as the oxide insulating film 24, the oxygen vacancies generated on the back channel side can be repaired by heat treatment. By this, defects contained in the semiconductor film 14 can be reduced, and thus, the reliability of the transistor 50 can be improved.

Next, the nitride insulating film 25 is formed by a sputtering method, a CVD method, or the like.

Note that in the case where the nitride insulating film 25 is formed by a plasma CVD method, the substrate placed in the treatment chamber of the plasma CVD apparatus that is vacuum-evacuated is preferably set to be higher than or equal to 300° C. and lower than or equal to 400° C., more preferably, higher than or equal to 320° C. and lower than or equal to 370° C., so that a dense nitride insulating film can be formed.

In the case where a silicon nitride film is formed by the plasma CVD method as the nitride insulating film 25, a deposition gas containing silicon, nitrogen, and ammonia are preferably used as a source gas. As the source gas, a small amount of ammonia compared to the amount of nitrogen is used, whereby ammonia is dissociated in the plasma and activated species are generated. The activated species cut a bond between silicon and hydrogen which are contained in a deposition gas containing silicon and a triple bond between nitrogen molecules. As a result, a dense silicon nitride film having few defects, in which bonding between silicon and nitrogen is promoted and there are few bonds between silicon and hydrogen can be formed. On the other hand, when the amount of ammonia with respect to nitrogen is large in a source gas, decomposition of a deposition gas containing silicon and decomposition of nitrogen are not promoted, so that a sparse silicon nitride film in which a bond between silicon and hydrogen remains and defects are increased is formed. Therefore, in a source gas, a flow rate ratio of the nitrogen to the ammonia is set to be greater than or equal to 5 and less than or equal to 50, preferably greater than or equal to 10 and less than or equal to 50.

Here, in the treatment chamber of a plasma CVD apparatus, a 50-nm-thick silicon nitride film is formed by a plasma CVD method in which silane with a flow rate of 50 sccm, nitrogen with a flow rate of 5000 sccm, and ammonia with a flow rate of 100 sccm are used as the source gas, the pressure in the treatment chamber is 100 Pa, the substrate temperature is 350° C., and a high-frequency power of 1000 W is supplied to parallel-plate electrodes with the use of a 27.12 MHz high-frequency power source. Note that the plasma CVD apparatus is a parallel-plate plasma CVD apparatus in which the electrode area is 6000 cm$^2$, and the power per unit area (power density) into which the supplied power is converted is $1.7 \times 10^{-1}$ W/cm$^2$.

By the above-described steps, the insulating film 26 including the oxide insulating film 23, the oxide insulating film 24, and the nitride insulating film 25 can be formed.

Next, heat treatment may be performed. The heat treatment is performed typically at a temperature of higher than or equal to 150° C. and lower than or equal to 300° C., preferably higher than or equal to 200° C. and lower than or equal to 250° C.

Through the above-described process, the transistor 50 can be manufactured.

Figure 15A:
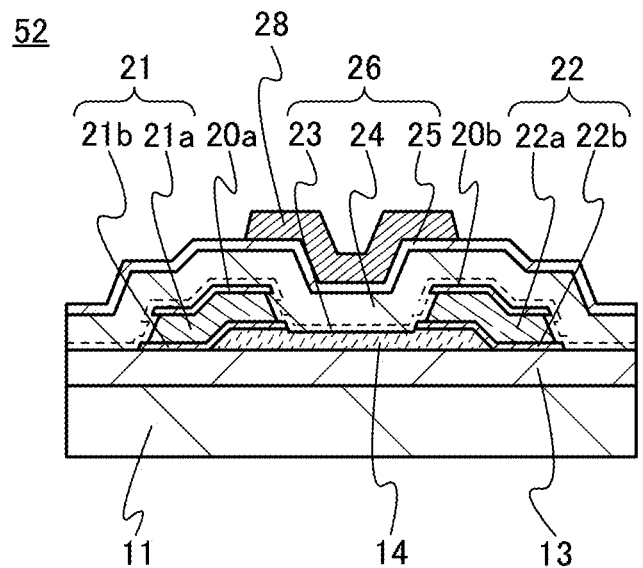
FIGS. 15A and 15B are cross-sectional views each illustrating one embodiment of a transistor.
Figure 15B:
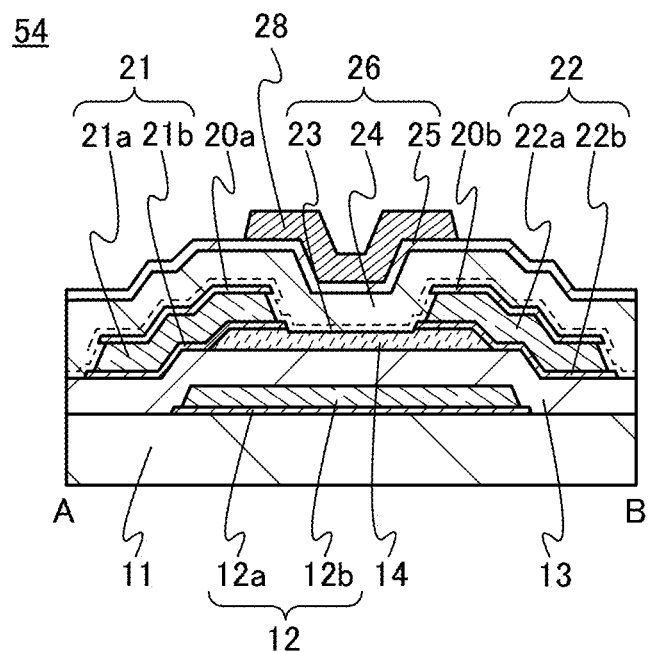

Note that although the transistor having a bottom-gate structure in which the gate electrode 12 is provided between the substrate 11 and the semiconductor film 14 is described in this embodiment, the transistor may be a transistor 52 having a top-gate structure in which the insulating film 26 serves as a gate insulating film and a gate electrode 28 is provided over the insulating film 26 as illustrated in FIG. 15A. In other words, the transistor may include the pair of electrodes 21 and 22 which include first protective films and conductive films over the semiconductor film 14, the second protective films 20a and 20b over the pair of electrodes 21 and 22, the insulating film 26 serving as a gate insulating film over the semiconductor film 14, the pair of electrodes 21 and 22, and the second protective films 20a and 20b, and the gate electrode 28 over the insulating film 26. Furthermore, the transistor may be a transistor 54 having a dual-gate structure in which the gate electrode 12 is provided between the substrate 11 and the semiconductor film 14 and the gate electrode 28 is provided over the insulating film 26 as illustrated in FIG. 15B.

In the transistor in this embodiment, each of the pair of electrodes includes at least the first protective film and the conductive film, and the second protective film whose side surface is located on the outer side of the conductive film is provided over the conductive film. Because the upper surface of the conductive film is covered with the second protective film and the side surface of the second protective film is located on the outer side of the conductive film, the area of the conductive film exposed to plasma, e.g., oxygen plasma, is decreased. Accordingly, the formation of a compound of the metal element contained in the conductive film by plasma irradiation is suppressed, and the metal element contained in the conductive film is unlikely to move to the semiconductor film.

In addition, because the semiconductor film is covered with the film to be the first protective films when the conductive film is processed into the conductive films of the pair of electrodes, the metal element contained in the conductive films is blocked by the film to be the first protective films and is unlikely to move to the semiconductor film.

Consequently, diffusion of an impurity which is a constituent element of wirings and electrodes, such as copper, aluminum, gold, silver, or molybdenum, into the semiconductor film can be suppressed. In addition, the concentration of the impurity in the semiconductor film can be decreased.

Accordingly, a semiconductor device with improved electrical characteristics can be obtained. In addition, a highly reliable semiconductor device can be obtained.

Embodiment 2

In this embodiment, a method for forming a pair of electrodes which is different from that in Embodiment 1 is described with reference to FIGS. 2A to 2D and FIGS. 4A to 4D.

In a manner similar to that in Embodiment 1, through the process of FIGS. 2A to 2D, the gate electrode 12, the gate insulating film 13, the semiconductor film 14, the film 17a to be the first protective films, the conductive film 17b, the masks 19a and 19b, and the pair of second protective films 20a and 20b are formed over the substrate 11 as illustrated in FIG. 2D.

Figure 4A:
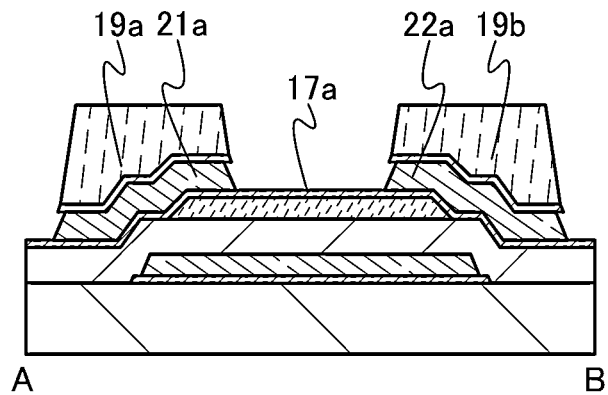
FIGS. 4A to 4D are cross-sectional views illustrating one embodiment of a method for manufacturing a transistor.

Next, as illustrated in FIG. 4A, part of the conductive film 17b is etched using the masks 19a and 19b to form the pair of conductive films 21a and 22a. Here, in a manner similar to that in Embodiment 1, a method is employed in which the film 17a to be the first protective films is not etched and the conductive film 17b is selectively etched. Consequently, the semiconductor film 14 is not exposed in this etching step; thus, the metal element contained in the conductive film 17b does not move to the semiconductor film 14 during etching of the conductive film 17b. In addition, the conductive film 17b is isotropically etched by using a wet etching method; thus, the conductive films 21a and 22a can be formed such that the side surfaces thereof are located on the inner side of the side surfaces of the second protective films 20a and 20b.

Figure 4B:
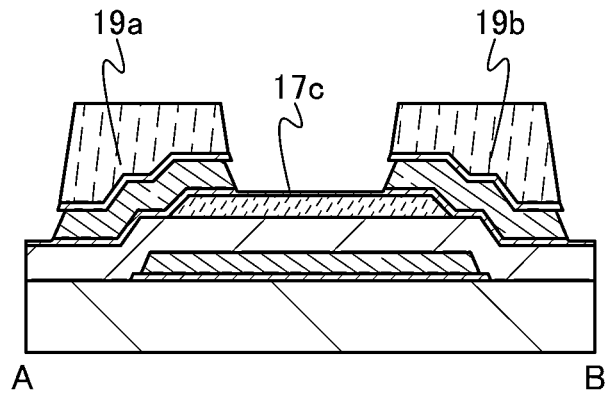

Next, a surface of the film 17a to be the first protective films is etched to remove copper remaining on the film 17a to be the first protective films. As a result, a film 17c to be the first protective films is formed as illustrated in FIG. 4B. Note that conditions in this etching step are preferably determined such that the conductive films 21a and 22a are not etched and the film 17a to be the first protective films is selectively etched. For such conditions, a hydrofluoric acid, a hydrochloric acid, a phosphoric acid, or the like can be used as an etchant. As an etching gas, a fluoride such as $SF_6$ or $CF_4$, a chloride such as $Cl_2$ or $BCl_3$, or a mixed gas of a fluoride and a chloride such as $SF_6$ and $BCl_3$ can be used. The film 17c to be the first protective films serves as a protective film for the semiconductor film 14 and is therefore preferably formed so as to cover the semiconductor film 14. For this purpose, in this etching step, the film 17a to be the first protective films may be etched several nanometers deep, typically 1 nm to 5 nm deep.

Figure 4C:
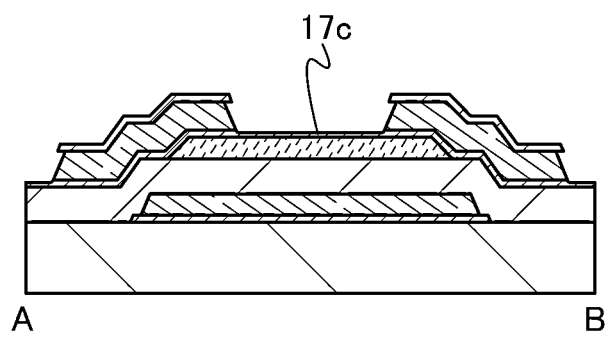

Next, the masks 19a and 19b are removed as illustrated in FIG. 4C. Here, the masks 19a and 19b are subjected to ashing treatment for ease of removal, and then the masks 19a and 19b are removed using a stripper.

Note that in the step of removing the masks 19a and 19b, the semiconductor film 14 is covered with the film 17c to be the first protective films and is not exposed. Thus, the metal element contained in the conductive films 21a and 22a does not move to the semiconductor film 14.

The masks 19a and 19b may be removed before the film 17c to be the first protective films is formed. In that case, the film 17a to be the first protective films is etched using the second protective films 20a and 20b as a mask.

Figure 4D:
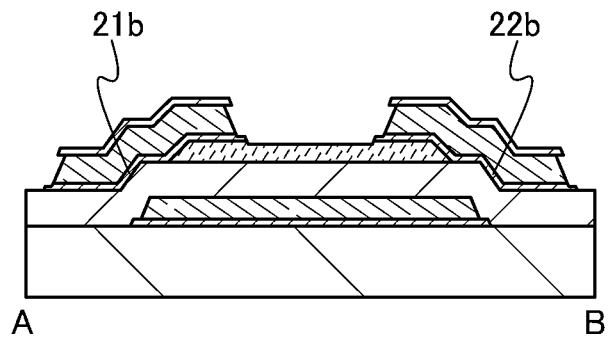

Next, as illustrated in FIG. 4D, part of the film 17c to be the first protective films is etched using the second protective films 20a and 20b to form the pair of first protective films 21b and 22b.

Here, the film 17c to be the first protective films is etched by a dry etching method using chlorine as an etching gas.

The side surfaces of the second protective films 20a and 20b are located on the outer side of the side surfaces of the conductive films 21a and 22a. In other words, the upper surfaces of the conductive films 21a and 22a are covered with the second protective films 20a and 20b, and the second protective films 20a and 20b extend outward beyond the side surface of the conductive films 21a and 22a. Therefore, when part of the film 17c to be the first protective films is etched, the side surfaces of the conductive films 21a and 22a are unlikely to be exposed to plasma. As a result, even when the semiconductor film 14 is exposed, movement of the metal element contained in the conductive films 21a and 22a to the semiconductor film 14 can be reduced.

Accordingly, the concentration of impurities in the semiconductor film 14 can be reduced.

Next, as illustrated in FIG. 3D, the insulating film 26 is formed over the semiconductor film 14, the pair of electrodes 21 and 22, and the pair of second protective films 20a and 20b in a manner similar to that in Embodiment 1.

Through the above-described process, a transistor can be manufactured.

In the transistor in this embodiment, each of the pair of electrodes includes at least the first protective film and the conductive film, and the second protective film whose side surface is located on the outer side of the conductive film is provided over the conductive film. Because the upper surface of the conductive film is covered with the second protective film and the side surface of the second protective film is located on the outer side of the conductive film, the area of the conductive film exposed to plasma, e.g., oxygen plasma, is decreased. Accordingly, the formation of a compound of the metal element contained in the conductive film by plasma irradiation is suppressed, and the metal element contained in the conductive film is unlikely to move to the semiconductor film.

In addition, because the semiconductor film is covered with the film to be the first protective films when the conductive film is processed into the conductive films of the pair of electrodes, the metal element contained in the conductive film is blocked by the film to be the first protective films and is unlikely to move to the semiconductor film.

Consequently, diffusion of an impurity which is a constituent element of wirings and electrodes, such as copper, aluminum, gold, silver, or molybdenum, into the semiconductor film can be suppressed. In addition, the concentration of the impurity in the semiconductor film can be decreased.

Accordingly, a semiconductor device with improved electrical characteristics can be obtained. In addition, a highly reliable semiconductor device can be obtained.

Embodiment 3

In this embodiment, a semiconductor device having a transistor in which the amount of defects in an oxide semiconductor film can be further reduced when the oxide semiconductor film is used as a semiconductor film is described with reference to drawings. The transistor described in this embodiment is different from that in Embodiment 1 in that a multilayer film having an oxide semiconductor film and an oxide film in contact with the oxide semiconductor film is included.

Figure 5A:
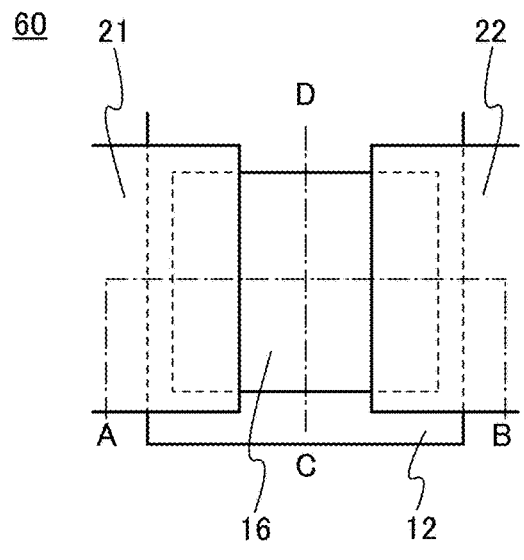
FIGS. 5A to 5C are a top view and cross-sectional views illustrating one embodiment of a transistor.
Figure 5C:
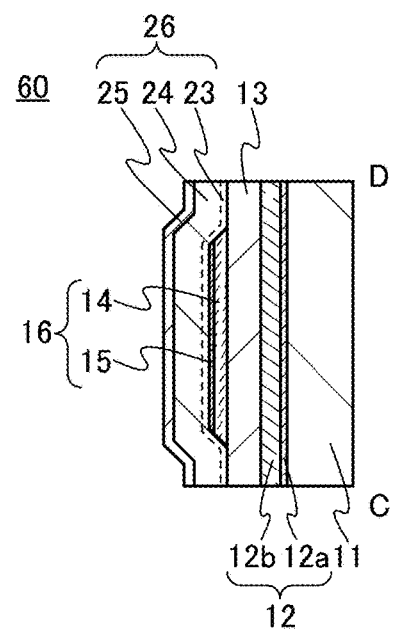
Figure 5B:
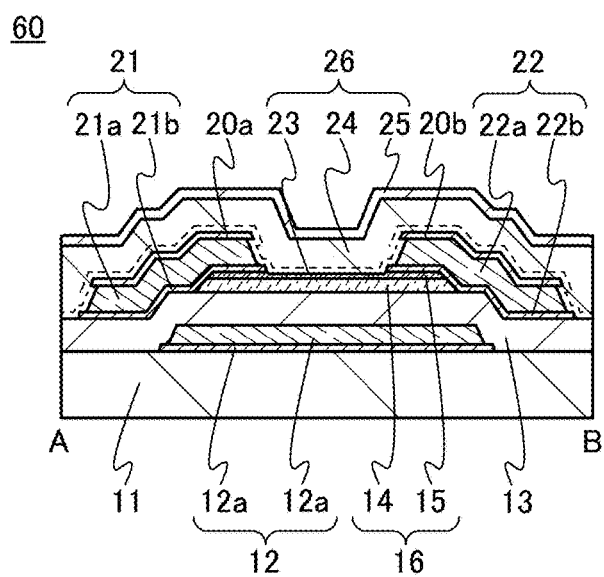

FIGS. 5A to 5C are a top view and cross-sectional views of a transistor 60 included in the semiconductor device. FIG. 5A is a top view of the transistor 60, FIG. 5B is a cross-sectional view taken along dashed-dotted line A-B in FIG. 5A, and FIG. 5C is a cross-sectional view taken along dashed-dotted line C-D in FIG. 5A. Note that in FIG. 5A, the substrate 11, one or more of components of the transistor 60 (e.g., the gate insulating film 13), the oxide insulating film 23, the oxide insulating film 24, the nitride insulating film 25, and the like are not illustrated for clarity.

The transistor 60 shown in FIGS. 5A to 5C includes a multilayer film 16 overlapping with the gate electrode 12 with the gate insulating film 13 provided therebetween, and the pair of electrodes 21 and 22 in contact with the multilayer film 16. Furthermore, the insulating film 26 including the oxide insulating film 23, the oxide insulating film 24, and the nitride insulating film 25 is formed over the gate insulating film 13, the multilayer film 16, and the pair of electrodes 21 and 22.

As the gate electrode 12, the protective film 12a and the conductive film 12b are stacked. Of the pair of electrodes 21 and 22, the electrode 21 includes at least the first protective film 21b in contact with the multilayer film 16 and the conductive film 21a, and the electrode 22 includes at least the first protective film 22b in contact with the multilayer film 16 and the conductive film 22a. In addition, the second protective films 20a and 20b are formed over the conductive films 21a and 22a, respectively.

In the transistor 60 described in this embodiment, the multilayer film 16 includes the semiconductor film 14 and the oxide film 15. That is, the multilayer film 16 has a two-layer structure. Further, part of the semiconductor film 14 serves as a channel region. Furthermore, the oxide insulating film 23 is formed in contact with the multilayer film 16, and the oxide insulating film 24 is formed in contact with the oxide insulating film 23. That is, the oxide film 15 is provided between the semiconductor film 14 and the oxide insulating film 23.

In the case where an oxide semiconductor is used for the semiconductor film 14, the oxide film 15 is an oxide film containing one or more elements which form the oxide semiconductor. Since the oxide film 15 contains one or more elements which form the semiconductor film 14, interface scattering is unlikely to occur at the interface between the semiconductor film 14 and the oxide film 15. Thus, the transistor can have a high field-effect mobility because the movement of carriers is not hindered at the interface.

The oxide film 15 is typically In—Ga oxide, In—Zn oxide, or In-M-Zn oxide (M represents Ti, Ga, Y, Zr, La, Ce, Nd, or Hf). The energy at the conduction band bottom of the oxide film 15 is closer to a vacuum level than that of the semiconductor film 14 is, and typically, the difference between the energy at the conduction band bottom of the oxide film 15 and the energy at the conduction band bottom of the semiconductor film 14 is any one of 0.05 eV or more, 0.07 eV or more, 0.1 eV or more, and 0.15 eV or more and any one of 2 eV or less, 1 eV or less, 0.5 eV or less, and 0.4 eV or less. That is, the difference between the electron affinity of the oxide film 15 and the electron affinity of the semiconductor film 14 is any one of 0.05 eV or more, 0.07 eV or more, 0.1 eV or more, and 0.15 eV or more and any one of 2 eV or less, 1 eV or less, 0.5 eV or less, and 0.4 eV or less.

The oxide film 15 preferably contains In because carrier mobility (electron mobility) can be increased.

When the oxide film 15 contains a larger amount of Ti, Ga, Y, Zr, La, Ce, Nd, or Hf in an atomic ratio than the amount of In in an atomic ratio, any of the following effects may be obtained:

(1) the energy gap of the oxide film 15 is widened;
(2) the electron affinity of the oxide film 15 decreases;
(3) an impurity from the outside is blocked;
(4) an insulating property increases as compared to the semiconductor film 14; and
(5) oxygen vacancies are less likely to be generated in the oxide film 15 containing a larger amount of Ti, Ga, Y, Zr, La, Ce, Nd, or Hf in an atomic ratio than the amount of In in an atomic ratio because Ti, Ga, Y, Zr, La, Ce, Nd, or Hf is a metal element which is strongly bonded to oxygen.

In the case where the oxide film 15 is an In-M-Zn oxide film (M represents Ti, Ga, Y, Zr, La, Ce, Nd, or Hf), the atomic ratio of metal elements of a sputtering target used for forming the In-M-Zn oxide film preferably satisfies M>In and Zn>M. As the atomic ratio of metal elements of such a sputtering target, In:Ga:Zn=1:3:4, In:Ga:Zn=1:3:5, In:Ga:Zn=1:3:6, In:Ga:Zn=1:3:7, In:Ga:Zn=1:3:8, In:Ga:Zn=1:3:9, In:Ga:Zn=1:3:10, In:Ga:Zn=1:6:7, In:Ga:Zn=1:6:8, In:Ga:Zn=1:6:9, or In:Ga:Zn=1:6:10 is preferable.

In the case where the oxide film 15 is an In-M-Zn oxide film, the proportions of In and M when summation of In and M is assumed to be 100 atomic % are preferably as follows: the atomic percentage of In is less than 50 atomic % and the atomic percentage of M is greater than or equal to 50 atomic %, or more preferably, the atomic percentage of In is less than 25 atomic % and the atomic percentage of M is greater than or equal to 75 atomic %.

Further, in the case where each of the semiconductor film 14 and the oxide film 15 is an In-M-Zn oxide film (M represents Ti, Ga, Y, Zr, La, Ce, Nd, or Hf), the proportion of M (M represents Ti, Ga, Y, Zr, La, Ce, Nd, or Hf) in the oxide film 15 is higher than that in the semiconductor film 14. Typically, the proportion of M in the oxide film 15 is 1.5 or more times, twice or more, or three or more times as high as that in the semiconductor film 14.

Furthermore, in the case where each of the semiconductor film 14 and the oxide film 15 is an In-M-Zn oxide film (M represents Ti, Ga, Y, Zr, La, Ce, Nd, or Hf), when In:M:Zn=$x_1$:$y_1$:$z_1$ [atomic ratio] is satisfied in the oxide film 15 and In:M:Zn=$x_2$:$y_2$:$z_2$ [atomic ratio] is satisfied in the semiconductor film 14, $y_1/x_1$ is higher than $y_2/x_2$, or preferably $y_1/x_1$ is 1.5 or more times as high as $y_2/x_2$. More preferably, $y_1/x_1$ is twice or more as high as $y_2/x_2$, or still more preferably $y_1/x_1$ is three or more times as high as $y_2/x_2$. In this case, it is preferable that in the semiconductor film 14, $y_2$ be higher than or equal to $x_2$ because a transistor including the semiconductor film 14 can have stable electrical characteristics. However, when $y_2$ is larger than or equal to three or more times $x_2$, the field-effect mobility of the transistor including the semiconductor film 14 is reduced. Accordingly, $y_2$ is preferably smaller than three times $x_2$.

A formation process which is similar to that of the semiconductor film in Embodiment 1 can be used for the semiconductor film 14.

The oxide film 15 can be formed using a sputtering target with an atomic ratio of In:M:Zn=1:3:3.05 to 1:3:10 or a sputtering target with an atomic ratio of In:M:Zn=1:6:6.05 to 1:6:10 can be used. Note that the atomic ratio of M/In and the atomic ratio of Zn/In in the semiconductor film 14 formed using such a sputtering target are lower than those in the sputtering target. The atomic ratio of Zn to M (Zn/M) in an In—Ga—Zn oxide film is higher than or equal to 0.5.

By a sputtering method using such a sputtering target, a film of an In—Ga—Zn oxide that is CAAC-OS can be formed.

The oxide film 15 serves also as a film which relieves damage to the semiconductor film 14 at the time of forming the oxide insulating film 24 later. Consequently, the amount of oxygen vacancies in the semiconductor film 14 can be reduced. In addition, by forming the oxide film 15, mixing of a constituent element of an insulating film, e.g., the oxide insulating film, formed over the semiconductor film 14 to the semiconductor film 14 can be inhibited.

The thickness of the oxide film 15 is greater than or equal to 3 nm and less than or equal to 100 nm, preferably greater than or equal to 3 nm and less than or equal to 50 nm.

Like the semiconductor film 14, the oxide film 15 can have a single crystal structure or a non-single-crystal structure as appropriate. Non-single-crystal structures include a c-axis aligned crystalline oxide semiconductor (CAAC-OS) described later, a polycrystalline structure, a microcrystalline structure described later, and an amorphous structure, for example.

Note that the semiconductor film 14 and the oxide film 15 may each be a mixed film including two or more of the following: a region having an amorphous structure, a region having a microcrystalline structure, a region having a polycrystalline structure, a CAAC-OS region, and a region having a single-crystal structure. The mixed film has a single-layer structure including, for example, two or more of a region having an amorphous structure, a region having a microcrystalline structure, a region having a polycrystalline structure, a CAAC-OS region, and a region having a single-crystal structure in some cases. Further, the mixed film has a stacked-layer structure including, for example, layers of two or more of a region having an amorphous structure, a region having a microcrystalline structure, a region having a polycrystalline structure, a CAAC-OS region, and a region having a single-crystal structure in some cases. Furthermore, a microcrystalline structure and CAAC-OS may be stacked as the semiconductor film 14 and the oxide film 15, respectively. Alternatively, the semiconductor film 14 may have a stacked-layer structure of a microcrystalline structure and CAAC-OS, and the oxide film 15 may be CAAC-OS.

It is preferable that the semiconductor film 14 and the oxide film 15 each be CAAC-OS, in which case the crystallinity at the interface between the semiconductor film 14 and the oxide film 15 can be increased. When the oxide film 15 is CAAC-OS, the oxide film 15 has a blocking function against the conductive films 21a and 22a included in the pair of electrodes 21 and 22 and can thus suppress movement of the metal element contained in the conductive films 21a and 22a to the semiconductor film 14.

Note that a channel formation region refers to a region in the multilayer film 16 which overlaps with the gate electrode 12 and is positioned between the pair of electrodes 21 and 22. Further, a channel region refers to a region in the channel formation region through which current mainly flows. Here, a channel region is part of the semiconductor film 14 which is positioned between the pair of electrodes 21 and 22. A channel length refers to a distance between the pair of electrodes 21 and 22.

Here, the oxide film 15 is provided between the semiconductor film 14 and the oxide insulating film 23. Hence, if trap states are formed between the oxide film 15 and the oxide insulating film 23 owing to impurities and defects, electrons flowing in the semiconductor film 14 are less likely to be captured by the trap states because there is a distance between the trap states and the semiconductor film 14. Accordingly, the amount of on-state current of the transistor can be increased, and the field-effect mobility can be increased. When electrons are captured by the trap states, the electrons become negative fixed charges. As a result, a threshold voltage of the transistor changes. However, by the distance between the semiconductor film 14 and the trap states, capture of the electrons by the trap states can be reduced, and accordingly a change of the threshold voltage can be reduced.

Further, impurities from the outside can be blocked by the oxide film 15, and accordingly, the amount of impurities which move from the outside to the semiconductor film 14 can be reduced. Further, an oxygen vacancy is less likely to be formed in the oxide film 15. Consequently, the impurity concentration and the amount of oxygen vacancies in the semiconductor film 14 can be reduced.

Note that the semiconductor film 14 and the oxide film 15 are not formed by simply stacking each film, but are formed to form a continuous junction (here, in particular, a structure in which the energy of the bottom of the conduction band is changed continuously between the films). In other words, a stacked-layer structure in which there exists no impurity which forms a defect level such as a trap center or a recombination center at each interface is provided. If an impurity exists between the semiconductor film 14 and the oxide film 15 which are stacked, a continuity of the energy band is damaged, and the carrier is captured or recombined at the interface and then disappears.

In order to form such a continuous junction, it is necessary to form films continuously without being exposed to air, with use of a multi-chamber deposition apparatus including a load lock chamber.

Note that in the multilayer film 16, an oxide film similar to the oxide film 15 may be formed between the gate insulating film 13 and the semiconductor film 14.

In the transistor described in this embodiment, the oxide film 15 is provided between the semiconductor film 14 and the oxide insulating film 23. Thus, it is possible to reduce the concentration of silicon or carbon in the semiconductor film 14 or the concentration of silicon or carbon in the vicinity of the interface between the semiconductor film 14 and the oxide film 15.

Since the transistor 60 having such a structure includes very few defects in the multilayer film 16 including the semiconductor film 14, the electrical characteristics of the transistor can be improved, and typically, the on-state current can be increased and the field-effect mobility can be improved. Further, in a BT stress test and a BT photostress test which are examples of a stress test, the amount of change in threshold voltage is small, and thus, reliability is high.

Note that the structures, methods, and the like described in this embodiment can be used as appropriate in combination with any of the structures, methods, and the like described in other embodiments and examples.

Embodiment 4

In this embodiment, a semiconductor device which is one embodiment of the present invention is described with reference to drawings. Note that in this embodiment, a display device is described as an example of a semiconductor device of one embodiment of the present invention. In addition, an oxide semiconductor film is used as a semiconductor film in this embodiment.

Figure 6A:
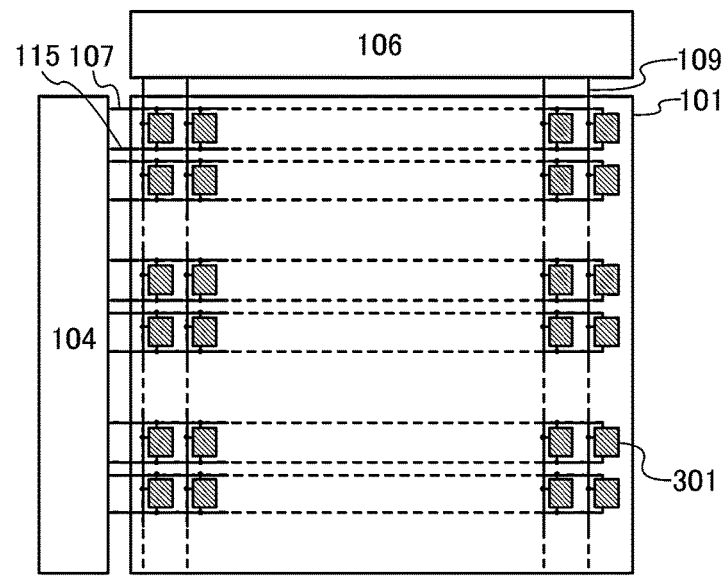
FIGS. 6A to 6C are a block diagram and circuit diagrams illustrating one embodiment of a semiconductor device.

FIG. 6A illustrates an example of a semiconductor device. The semiconductor device in FIG. 6A includes a pixel portion 101, a scan line driver circuit 104, a signal line driver circuit 106, m scan lines 107 which are arranged in parallel or substantially in parallel and whose potentials are controlled by the scan line driver circuit 104, and n signal lines 109 which are arranged in parallel or substantially in parallel and whose potentials are controlled by the signal line driver circuit 106. Further, the pixel portion 101 includes a plurality of pixels 301 arranged in a matrix. Furthermore, capacitor lines 115 arranged in parallel or substantially in parallel are provided along the scan lines 107. Note that the capacitor lines 115 may be arranged in parallel or substantially in parallel along the signal lines 109. The scan line driver circuit 104 and the signal line driver circuit 106 are collectively referred to as a driver circuit portion in some cases.

Each of the scan lines 107 is electrically connected to the n pixels 301 in the corresponding row among the pixels 301 arranged in m rows and n columns in the pixel portion 101. Each of the signal lines 109 is electrically connected to the m pixels 301 in the corresponding column among the pixels 301 arranged in m rows and n columns. Note that m and n are each an integer of 1 or more. Each of the capacitor lines 115 is electrically connected to the n pixels 301 in the corresponding row among the pixels 301 arranged in m rows and n columns. Note that in the case where the capacitor lines 115 are arranged in parallel or substantially in parallel along the signal lines 109, each of the capacitor lines 115 is electrically connected to the m pixels 301 in the corresponding column among the pixels 301 arranged in m rows and n columns.

Figure 6B:
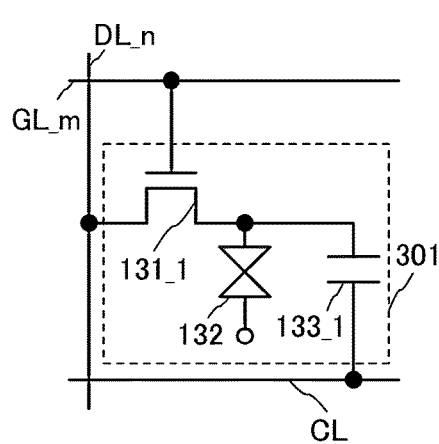
Figure 6C:
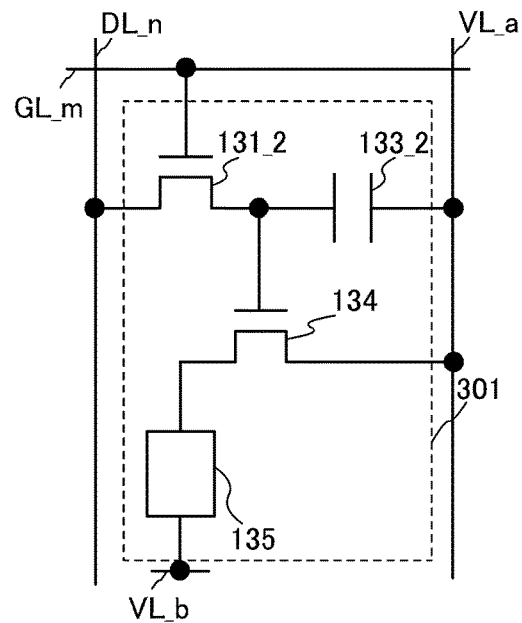

FIGS. 6B and 6C illustrate circuit configurations that can be used for the pixels 301 in the display device illustrated in FIG. 6A.

The pixel 301 illustrated in FIG. 6B includes a liquid crystal element 132, a transistor 131_1, and a capacitor 133_1.

The potential of one of a pair of electrodes of the liquid crystal element 132 is set according to the specifications of the pixels 301 as appropriate. The alignment state of the liquid crystal element 132 depends on written data. A common potential may be applied to one of the pair of electrodes of the liquid crystal element 132 included in each of the plurality of pixels 301. Further, the potential supplied to one of a pair of electrodes of the liquid crystal element 132 in the pixel 301 in one row may be different from the potential supplied to one of a pair of electrodes of the liquid crystal element 132 in the pixel 301 in another row.

As examples of a driving method of the display device including the liquid crystal element 132, any of the following modes can be given: a TN mode, an STN mode, a VA mode, an ASM (axially symmetric aligned micro-cell) mode, an OCB (optically compensated birefringence) mode, an FLC (ferroelectric liquid crystal) mode, an AFLC (anti-ferroelectric liquid crystal) mode, an MVA mode, a PVA (patterned vertical alignment) mode, an IPS mode, an FFS mode, a TBA (transverse bend alignment) mode, and the like. Other examples of the driving method of the display device include an ECB (electrically controlled birefringence) mode, a PDLC (polymer dispersed liquid crystal) mode, a PNLC (polymer network liquid crystal) mode, and a guest-host mode. Note that the present invention is not limited to these examples, and various liquid crystal elements and driving methods can be applied to the liquid crystal element and the driving method thereof.

The liquid crystal element may be formed using a liquid crystal composition including liquid crystal exhibiting a blue phase and a chiral material. The liquid crystal exhibiting a blue phase has a short response time of 1 msec or less and is optically isotropic; therefore, alignment treatment is not necessary and viewing angle dependence is small.

In the pixel 301 in the m-th row and the n-th column, one of a source electrode and a drain electrode of the transistor 131_1 is electrically connected to a signal line DL_n, and the other is electrically connected to the other of the pair of electrodes of the liquid crystal element 132. A gate electrode of the transistor 131_1 is electrically connected to a scan line GL_m. The transistor 131_1 has a function of controlling whether to write a data signal by being turned on or off.

One of a pair of electrodes of the capacitor 133_1 is electrically connected to a wiring to which a potential is supplied (hereinafter referred to as a capacitor line CL), and the other is electrically connected to the other of the pair of electrodes of the liquid crystal element 132. The potential of the capacitor line CL is set in accordance with the specifications of the pixel 301 as appropriate. The capacitor 133_1 functions as a storage capacitor for storing written data.

For example, in the display device including the pixel 301 in FIG. 6B, the pixels 301 are sequentially selected row by row by the scan line driver circuit 104, whereby the transistors 131_1 are turned on and a data signal is written.

When the transistors 131_1 are turned off, the pixels 301 in which the data has been written are brought into a holding state. This operation is sequentially performed row by row; thus, an image is displayed.

The pixel 301 illustrated in FIG. 6C includes a transistor 131_2, a capacitor 133_2, a transistor 134, and a light-emitting element 135.

One of a source electrode and a drain electrode of the transistor 131_2 is electrically connected to a wiring to which a data signal is supplied (hereinafter referred to as a signal line DL_n). A gate electrode of the transistor 131_2 is electrically connected to a wiring to which a gate signal is supplied (hereinafter referred to as a scan line GL_m).

The transistor 131_2 has a function of controlling whether to write a data signal by being turned on or off.

One of a pair of electrodes of the capacitor 133_2 is electrically connected to a wiring to which a potential is supplied (hereinafter referred to as a potential supply line VL_a), and the other is electrically connected to the other of the source electrode and the drain electrode of the transistor 131_2.

The capacitor 133_2 functions as a storage capacitor for storing written data.

One of a source electrode and a drain electrode of the transistor 134 is electrically connected to the potential supply line VL_a. Further, a gate electrode of the transistor 134 is electrically connected to the other of the source electrode and the drain electrode of the transistor 131_2.

One of an anode and a cathode of the light-emitting element 135 is electrically connected to a potential supply line VL_b, and the other is electrically connected to the other of the source electrode and the drain electrode of the transistor 134.

As the light-emitting element 135, an organic electroluminescent element (also referred to as an organic EL element) or the like can be used, for example. Note that the light-emitting element 135 is not limited to organic EL elements; an inorganic EL element including an inorganic material can be used.

A high power supply potential VDD is supplied to one of the potential supply line VL_a and the potential supply line VL_b, and a low power supply potential VSS is supplied to the other.

In the display device including the pixel 301 in FIG. 6C, the pixels 301 are sequentially selected row by row by the scan line driver circuit 104, whereby the transistors 131_2 are turned on and a data signal is written.

When the transistors 131_2 are turned off, the pixels 301 in which the data has been written are brought into a holding state. Further, the amount of current flowing between the source electrode and the drain electrode of the transistor 134 is controlled in accordance with the potential of the written data signal. The light-emitting element 135 emits light with a luminance corresponding to the amount of flowing current. This operation is sequentially performed row by row; thus, an image is displayed.

Figure 7:
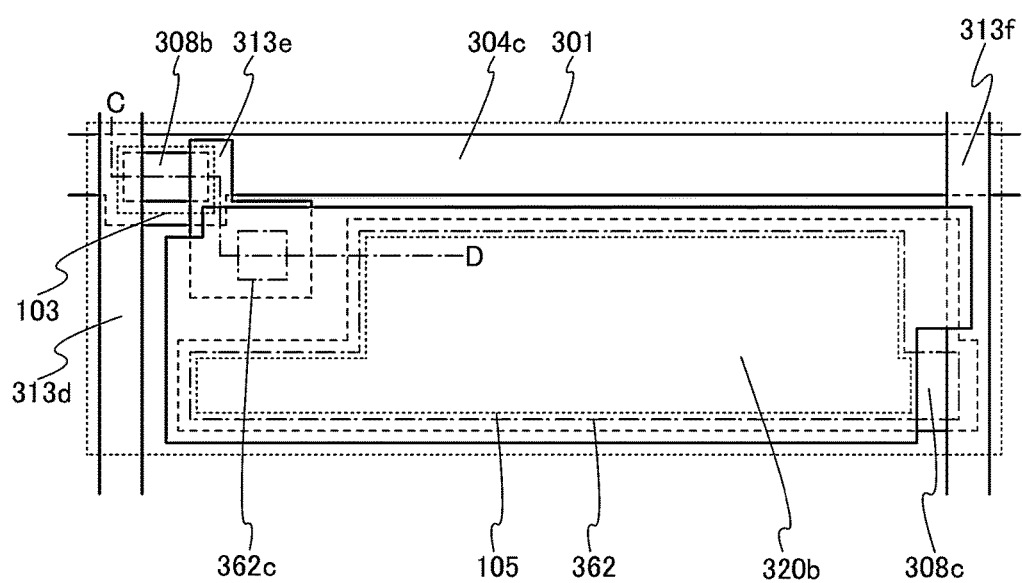
FIG. 7 is a top view illustrating one embodiment of a semiconductor device.

Next, a specific example of a liquid crystal display device including a liquid crystal element in the pixel 301 is described. FIG. 7 is a top view of the pixel 301 shown in FIG. 6B. Note that in FIG. 7, a counter electrode, a liquid crystal element, and first protective films 314d and 314e are omitted.

In FIG. 7, a conductive film 304c serving as a scan line extends substantially perpendicularly to the signal line (in the horizontal direction in the drawing). A conductive film 313d serving as a signal line extends substantially perpendicularly to the scan line (in the vertical direction in the drawing). A conductive film 313f serving as a capacitor line extends in parallel to the signal line. Note that the conductive film 304c serving as a scan line is electrically connected to the scan line driver circuit 104 (see FIG. 6A), and the conductive film 313*d* serving as a signal line and the conductive film 313*f* serving as a capacitor line are electrically connected to the signal line driver circuit 106 (see FIG. 6A).

A transistor 103 is provided at a region where the scan line and the signal line cross each other. The transistor 103 includes the conductive film 304*c* serving as a gate electrode; a gate insulating film (not illustrated in FIG. 7); a semiconductor film 308*b* where a channel region is formed, over the gate insulating film; and the conductive films 313*d* and 313*e* serving as a source electrode and a drain electrode. The conductive film 304*c* also serves as a scan line, and a region of the conductive film 304*c* that overlaps with the semiconductor film 308*b* serves as the gate electrode of the transistor 103. In addition, the conductive film 313*d* also serves as a signal line, and a region of the conductive film 313*d* that overlaps with the semiconductor film 308*b* serves as the source electrode or drain electrode of the transistor 103. Further, in the top view of FIG. 7, an end portion of the scan line is located on the outer side of an end portion of the semiconductor film 308*b*. Thus, the scan line functions as a light-blocking film for blocking light from a light source such as a backlight. For this reason, the semiconductor film 308*b* included in the transistor is not irradiated with light, so that a variation in the electrical characteristics of the transistor can be suppressed.

The conductive film 313*e* is electrically connected to a light-transmitting conductive film 320*b* that serves as a pixel electrode, through an opening 362*c*.

A capacitor 105 is connected to the conductive film 313*f* serving as a capacitor line through an opening 362. The capacitor 105 includes a conductive film 308*c* formed over the gate insulating film, a dielectric film formed of a nitride insulating film formed over the transistor 103, and the light-transmitting conductive film 320*b* that serves as the pixel electrode. The conductive film 308*c* formed over the gate insulating film has a light-transmitting property. That is, the capacitor 105 has a light-transmitting property.

Thanks to the light-transmitting property of the capacitor 105, the capacitor 105 can be formed large (covers a large area) in the pixel 301. Thus, a semiconductor device with increased charge capacity and an increased aperture ratio of 50% or more, preferably 55% or more, more preferably 60% or more can be obtained. For example, in a semiconductor device with a high resolution such as a liquid crystal display device, the area of a pixel is small and thus the area of a capacitor is also small. For this reason, the charge capacity of the capacitor is small. However, since the capacitor 105 of this embodiment has a light-transmitting property, when it is provided in a pixel, enough charge capacity can be obtained in the pixel and the aperture ratio can be increased. Typically, the capacitor 105 can be favorably used in a high-resolution semiconductor device with a pixel density of 200 ppi or more, or furthermore, 300 ppi or more.

The pixel 301 illustrated in FIG. 7 has a shape in which a side parallel to the conductive film 304*c* serving as a scan line is longer than a side parallel to the conductive film 313*d* serving as a signal line and the conductive film 313*f* serving as a capacitor line extends in parallel to the conductive film 313*d* serving as a signal line. As a result, the area where the conductive film 313*f* occupies in the pixel 301 can be decreased, thereby increasing the aperture ratio. In addition, the conductive film 313*f* serving as a capacitor line does not use a connection electrode and is in direct contact with the conductive film 308*c*, and thus the aperture ratio can be further increased.

Further, according to one embodiment of the present invention, the aperture ratio can be improved even in a display device with a high resolution, which makes it possible to use light from a light source such as a backlight efficiently, so that power consumption of the display device can be reduced.

Figure 8:
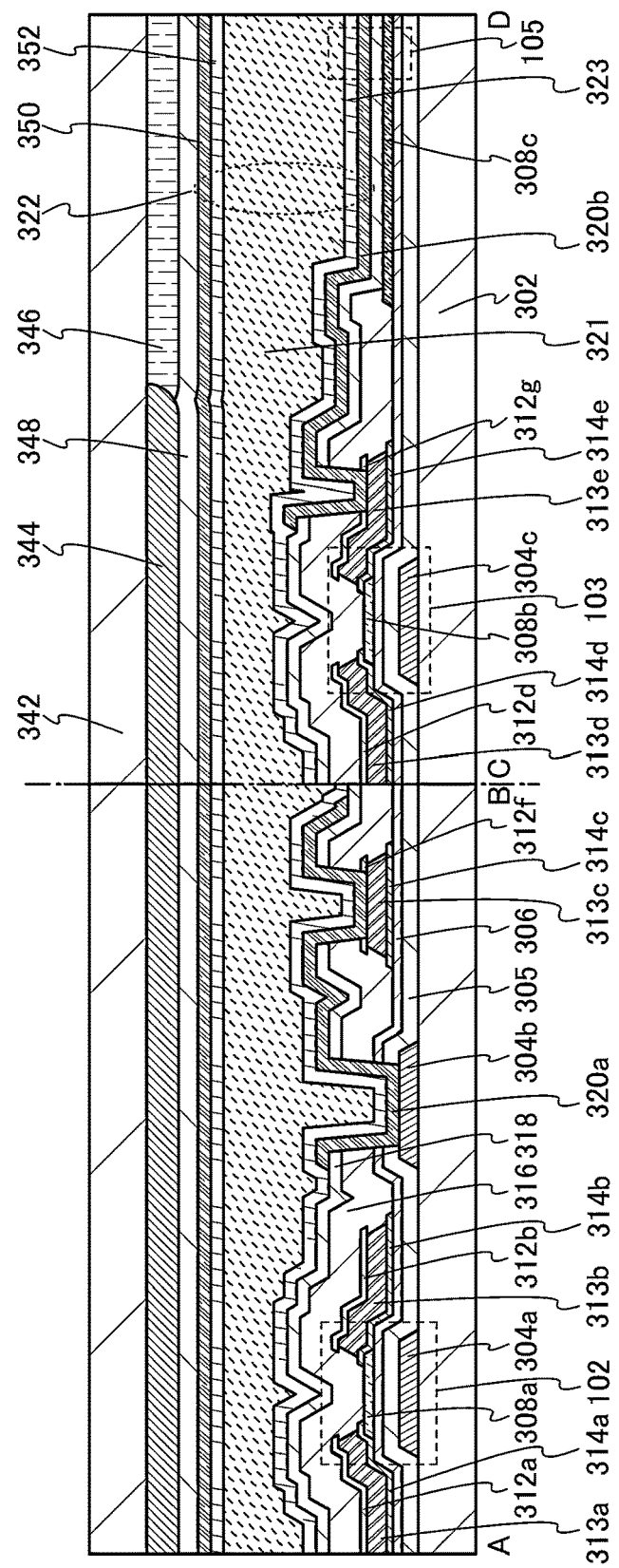
FIG. 8 is a cross-sectional view illustrating one embodiment of a semiconductor device.

FIG. 8 shows a cross section taken along dashed-dotted line C-D in FIG. 7. Note that a cross section A-B in FIG. 8 is a cross-sectional view of a driver circuit portion (a top view thereof is omitted) including the scan line driver circuit 104 and the signal line driver circuit 106. In this embodiment, a liquid crystal display device of a vertical electric field mode is described.

In the liquid crystal display device described in this embodiment, a liquid crystal element 322 is provided between a pair of substrates (a substrate 302 and a substrate 342).

The liquid crystal element 322 includes the light-transmitting conductive film 320*b* over the substrate 302, films controlling alignment (hereinafter referred to as alignment films 323 and 352), a liquid crystal layer 321, and a conductive film 350. Note that the light-transmitting conductive film 320*b* functions as one electrode of the liquid crystal element 322, and the conductive film 350 functions as the other electrode of the liquid crystal element 322.

Thus, a "liquid crystal display device" refers to a device including a liquid crystal element. Note that the liquid crystal display device includes a driver circuit for driving a plurality of pixels and the like. The liquid crystal display device may also be referred to as a liquid crystal module including a control circuit, a power supply circuit, a signal generation circuit, a backlight module, and the like provided over another substrate.

In the driver circuit portion, a transistor 102 includes a conductive film 304*a* functioning as a gate electrode, insulating films 305 and 306 collectively functioning as a gate insulating film, a semiconductor film 308*a* in which a channel region is formed, and conductive films 313*a* and 313*b* and first protective films 314*a* and 314*b* functioning as a source electrode and a drain electrode. The semiconductor film 308*a* is provided over the gate insulating film. Second protective films 312*a* and 312*b* are provided over the conductive films 313*a* and 313*b*. Note that in the case where the second protective films 312*a* and 312*b* are formed using a light-transmitting conductive film, the second protective films 312*a* and 312*b* function as the source electrode and the drain electrode and are included in the transistor 102.

In the pixel portion, the transistor 103 includes the conductive film 304*c* functioning as a gate electrode, the insulating films 305 and 306 collectively functioning as a gate insulating film, the semiconductor film 308*b* which is formed over the gate insulating film and in which a channel region is formed, and the conductive films 313*d* and 313*e* and the first protective films 314*d* and 314*e* functioning as a source electrode and a drain electrode. The semiconductor film 308*b* is provided over the gate insulating film. Second protective films 312*d* and 312*g* are provided over the conductive films 313*d* and 313*e*. Insulating films 316 and 318 are provided as protective films over the second protective films 312*d* and 312*g*. Note that in the case where the second protective films 312*d* and 312*g* are formed using a light-transmitting conductive film, the second protective films 312*d* and 312*g* function as the source electrode and the drain electrode and are included in the transistor 103.

The light-transmitting conductive film 320*b* functioning as a pixel electrode is connected to the conductive film 313*e* through an opening provided in the second protective film 312g, the insulating film 316, and the insulating film 318.

Further, the capacitor 105 includes the conductive film 308c functioning as one electrode of the capacitor 105, the insulating film 318 functioning as a dielectric film, and the light-transmitting conductive film 320b functioning as the other electrode of the capacitor 105. The conductive film 308c is provided over the gate insulating film.

In the driver circuit portion, a conductive film 304b formed at the same time as the conductive films 304a and 304c and a conductive film 313c formed at the same time as the conductive films 313a, 313b, 313d, and 313e are connected to each other via a light-transmitting conductive film 320a formed at the same time as the light-transmitting conductive film 320b.

The conductive film 304b and the light-transmitting conductive film 320a are connected to each other through an opening provided in the insulating film 305, the insulating film 306, the insulating film 316, and the insulating film 318. Further, the conductive film 313c and the light-transmitting conductive film 320a are connected to each other through an opening provided in a second protective film 312f, the insulating film 316, and the insulating film 318.

Here, components of the display device shown in FIG. 8 are described below.

The conductive films 304a, 304b, and 304c are formed over the substrate 302. The conductive film 304a functions as a gate electrode of the transistor in the driver circuit portion. The conductive film 304c is formed in the pixel portion 101 and functions as a gate electrode of the transistor in the pixel portion. The conductive film 304b is formed in the scan line driver circuit 104 and connected to the conductive film 313c.

The substrate 302 can be formed using the material of the substrate 11 which is given in Embodiment 1, as appropriate.

The conductive films 304a, 304b, and 304c can be formed using the material and the formation method of the gate electrode 12 which are described in Embodiment 1, as appropriate.

The insulating films 305 and 306 are formed over the substrate 302 and the conductive films 304a, 304c, and 304b. The insulating films 305 and 306 function as a gate insulating film of the transistor in the driver circuit portion and a gate insulating film of the transistor in the pixel portion 101.

The insulating film 305 is preferably formed using the nitride insulating film which is described as the gate insulating film 13 in Embodiment 1. The insulating film 306 is preferably formed using the oxide insulating film which is described as the gate insulating film 13 in Embodiment 1.

The semiconductor films 308a and 308b and the conductive film 308c are formed over the insulating film 306. The semiconductor film 308a is formed in a position overlapping with the conductive film 304a and functions as a channel region of the transistor in the driver circuit portion. The semiconductor film 308b is formed in a position overlapping with the conductive film 304c and functions as a channel region of the transistor in the pixel portion. The conductive film 308c functions as one electrode of the capacitor 105.

The semiconductor films 308a and 308b and the conductive film 308c can be formed using the material and the formation method of the semiconductor film 14 which are described in Embodiment 1, as appropriate.

The conductive film 308c is a film containing a metal element similar to the semiconductor films 308a and 308b and contains impurities. An example of the impurities is hydrogen. Instead of hydrogen, as the impurity, boron, phosphorus, tin, antimony, a rare gas element, alkali metal, alkaline earth metal, or the like may be included.

Both the semiconductor films 308a and 308b and the conductive film 308c are formed over the gate insulating film but differ in impurity concentration. Specifically, the conductive film 308c has a higher impurity concentration than the semiconductor films 308a and 308b. For example, the concentration of hydrogen contained in each of the semiconductor films 308a and 308b is lower than or equal to $5\times10^{19}$ atoms/cm$^3$, preferably lower than or equal to $5\times10^{18}$ atoms/cm$^3$, more preferably lower than or equal to $1\times10^{18}$ atoms/cm$^3$, still more preferably lower than or equal to $5\times10^{17}$ atoms/cm$^3$, yet more preferably lower than or equal to $1\times10^{16}$ atoms/cm$^3$. The concentration of hydrogen contained in the conductive film 308c is higher than or equal to $8\times10^{19}$ atoms/cm$^3$, preferably higher than or equal to $1\times10^{20}$ atoms/cm$^3$, more preferably higher than or equal to $5\times10^{20}$ atoms/cm$^3$. The concentration of hydrogen contained in the conductive film 308c is greater than or equal to 2 times, preferably greater than or equal to 10 times those in the semiconductor films 308a and 308b.

The conductive film 308c has lower resistivity than the semiconductor films 308a and 308b. The resistivity of the conductive film 308c is preferably greater than or equal to $1\times10^{-8}$ times and less than or equal to $1\times10^{-1}$ times the resistivity of the semiconductor films 308a and 308b. The resistivity of the conductive film 308c is typically greater than or equal to $1\times10^{-3}$ Ω·cm and less than $1\times10^4$ Ωcm, preferably greater than or equal to $1\times10^{-3}$ Ωcm and less than $1\times10^{-1}$ Ωcm.

The semiconductor films 308a and 308b are in contact with the films each formed using a material which can improve characteristics of the interface with the semiconductor film, such as the insulating film 306 and the insulating film 316. Thus, the semiconductor films 308a and 308b function as semiconductors, so that the transistors including the semiconductor films 308a and 308b have excellent electrical characteristics.

The conductive film 308c is in contact with the insulating film 318 in the opening 362 (see FIG. 11A). The insulating film 318 is formed using a material which prevents diffusion of impurities from the outside, such as water, alkali metal, and alkaline earth metal, into the semiconductor film, and the material further includes hydrogen. Thus, when hydrogen in the insulating film 318 is diffused into the semiconductor film formed at the same time as the semiconductor films 308a and 308b, hydrogen is bonded to oxygen and electrons serving as carriers are generated in the semiconductor film. Further, when the insulating film 318 is formed by a plasma CVD method or a sputtering method, a semiconductor film 308d is exposed to plasma, so that oxygen vacancies are generated. When hydrogen contained in the insulating film 318 enters the oxygen vacancies, electrons serving as carriers are generated. As a result, the conductivity of the semiconductor film is increased, so that the semiconductor film 308d becomes the conductive film 308c. In other words, the conductive film 308c can be referred to as an oxide semiconductor film with high conductivity or a metal oxide film with high conductivity.

Note that one embodiment of the present invention is not limited thereto, and it is possible that the conductive film 308c be not in contact with the insulating film 318 depending on circumstances.

Further, one embodiment of the present invention is not limited thereto, and the conductive film 308c may be formed by a different process from that of the semiconductor film 308a or the semiconductor film 308b depending on circumstances. In that case, the conductive film 308c may include a different material from that of the semiconductor film 308a or the semiconductor film 308b. For example, the conductive film 308c may be formed using indium tin oxide, indium oxide containing tungsten oxide, indium zinc oxide containing tungsten oxide, indium oxide containing titanium oxide, indium tin oxide containing titanium oxide, indium tin oxide, indium zinc oxide, indium tin oxide containing silicon oxide, or the like.

In the semiconductor device illustrated in this embodiment, one electrode of the capacitor is formed at the same time as the semiconductor film of the transistor. In addition, the light-transmitting conductive film that serves as a pixel electrode is used as the other electrode of the capacitor. Thus, a step of forming another conductive film is not needed to form the capacitor, and the number of steps of manufacturing the semiconductor device can be reduced. Further, since the pair of electrodes has a light-transmitting property, the capacitor has a light-transmitting property. As a result, the area occupied by the capacitor can be increased and the aperture ratio in a pixel can be increased.

The second protective films 312a, 312b, 312d, 312f, and 312g can be formed using the material and the formation method of the second protective films 20a and 20b which are described in Embodiment 1, as appropriate.

The conductive films 313a, 313b, 313c, 313d, and 313e can be formed using the material and the formation method of the conductive films 21a and 22a included in the pair of electrodes 21 and 22 which are described in Embodiment 1, as appropriate.

The first protective films 314a, 314b, 314d, and 314e and a first protective film 314c can be formed using the material and the formation method of the first protective films 21b and 22b which are described in Embodiment 1, as appropriate.

The insulating films 316 and 318 are formed over the insulating film 306, the semiconductor films 308a and 308b, the conductive film 308c, the second protective films 312a, 312b, 312d, 312f, and 312g, the conductive films 313a, 313b, 313c, 313d, and 313e, and the first protective films 314a, 314b, 314c, 314d, and 314e. For the insulating film 316, in a manner similar to that of the insulating film 306, a material which can improve characteristics of the interface with the semiconductor films 308a and 308b is preferably used. The insulating film 316 can be formed using a material and a formation method which are similar to those of the oxide insulating film 24 which are described in at least Embodiment 1, as appropriate. Further, as described in Embodiment 1, the oxide insulating film 23 and the oxide insulating film 24 may be stacked.

For the insulating film 318, in a manner similar to that of the insulating film 305, a material which prevents diffusion of impurities from the outside, such as water, alkali metal, and alkaline earth metal, into the semiconductor film is preferably used. A nitride insulating film of silicon nitride, silicon nitride oxide, aluminum nitride, aluminum nitride oxide, or the like can be used as appropriate. The thickness of the insulating film 318 is greater than or equal to 30 nm and less than or equal to 200 nm, preferably greater than or equal to 50 nm and less than or equal to 150 nm. The insulating film 318 can be formed as appropriate by a sputtering method, a CVD method, or the like.

Figure 12A:
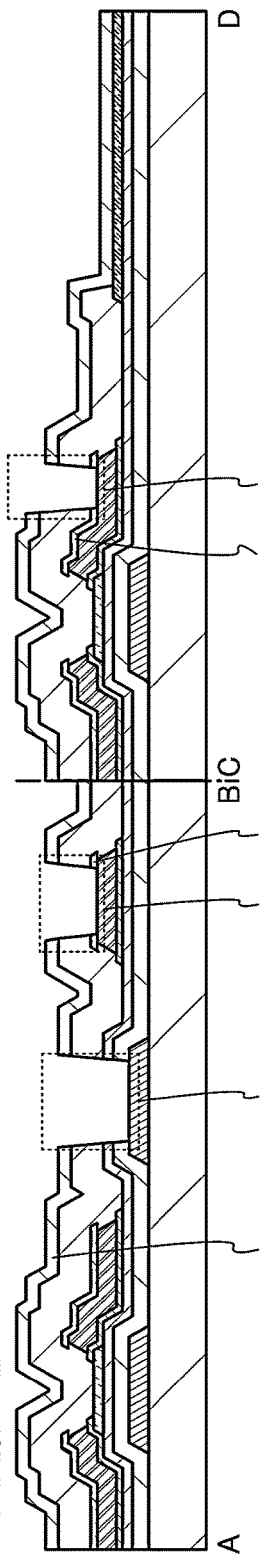
FIGS. 12A to 12C are cross-sectional views illustrating one embodiment of a method for manufacturing a semiconductor device.

Further, the light-transmitting conductive films 320a and 320b are provided over the insulating film 318. The light-transmitting conductive film 320a is electrically connected to the conductive film 304b through an opening 364a (see FIG. 12A) and electrically connected to the conductive film 313c through an opening 364b (see FIG. 12A). That is, the light-transmitting conductive film 320a functions as a connection electrode which connects the conductive film 304b and the conductive film 313c. The light-transmitting conductive film 320b is electrically connected to the conductive film 313e through an opening 364c (see FIG. 12A) and functions as the pixel electrode of a pixel. Further, the light-transmitting conductive film 320b can function as one of the pair of electrodes of the capacitor.

In order to form a connection structure in which the conductive film 304b is in direct contact with the conductive film 313c, it is necessary to form a mask by patterning for forming an opening in the insulating films 305 and 306 before the conductive film 313c is formed. However, the photomask is not needed to obtain the connection structure in FIG. 8. When the conductive film 304b is connected to the conductive film 313c with the light-transmitting conductive film 320a as shown in FIG. 8, it is not necessary to form a connection portion where the conductive film 304b is in direct contact with the conductive film 313c. Thus, the number of photomasks can be reduced by one. That is, steps for manufacturing a semiconductor device can be reduced.

For the light-transmitting conductive films 320a and 320b, a light-transmitting conductive material such as indium oxide containing tungsten oxide, indium zinc oxide containing tungsten oxide, indium oxide containing titanium oxide, indium tin oxide containing titanium oxide, ITO, indium zinc oxide, or indium tin oxide containing silicon oxide can be used.

A film having a coloring property (hereinafter referred to as a coloring film 346) is formed on the substrate 342. The coloring film 346 functions as a color filter. Further, a light-blocking film 344 adjacent to the coloring film 346 is formed on the substrate 342. The light-blocking film 344 functions as a black matrix. The coloring film 346 is not necessarily provided in the case where the display device is a monochrome display device, for example.

The coloring film 346 is a coloring film that transmits light in a specific wavelength range. For example, a red (R) color filter for transmitting light in a red wavelength range, a green (G) color filter for transmitting light in a green wavelength range, a blue (B) color filter for transmitting light in a blue wavelength range, or the like can be used.

The light-blocking film 344 preferably has a function of blocking light in a particular wavelength region, and can be a metal film or an organic insulating film including a black pigment.

An insulating film 348 is formed on the coloring film 346. The insulating film 348 functions as a planarization layer or suppresses diffusion of impurities in the coloring film 346 to the liquid crystal element side.

The conductive film 350 is formed on the insulating film 348. The conductive film 350 functions as the other of the pair of electrodes of the liquid crystal element in the pixel portion. Note that an insulating film that functions as an alignment film may be additionally formed on the light-transmitting conductive films 320a and 320b and the conductive film 350.

The liquid crystal layer 321 is formed between the light-transmitting conductive films 320a and 320b and the conductive film 350. The liquid crystal layer 321 is sealed between the substrate 302 and the substrate 342 with the use of a sealant (not illustrated). The sealant is preferably in contact with an inorganic material to prevent entry of moisture and the like from the outside.

A spacer may be provided between the light-transmitting conductive films 320a and 320b and the conductive film 350 to maintain the thickness of the liquid crystal layer 321 (also referred to as a cell gap).

A method for manufacturing an element portion over the substrate 302 in the semiconductor device illustrated in FIG. 8 is described with reference to FIGS. 9A to 9C, FIGS. 10A to 10C, FIGS. 11A to 11C, and FIGS. 12A to 12C.

First, the substrate 302 is prepared. Here, a glass substrate is used as the substrate 302.

Next, a conductive film is formed over the substrate 302 and processed into desired regions, so that the conductive films 304a, 304b, and 304c are formed. The conductive films 304a, 304b, and 304c can be formed in such a manner that a mask is formed in the desired regions by first patterning and regions not covered with the mask are etched (see FIG. 9A).

The conductive films 304a, 304b, and 304c can be typically formed by an evaporation method, a CVD method, a sputtering method, a spin coating method, or the like.

Figure 9A:
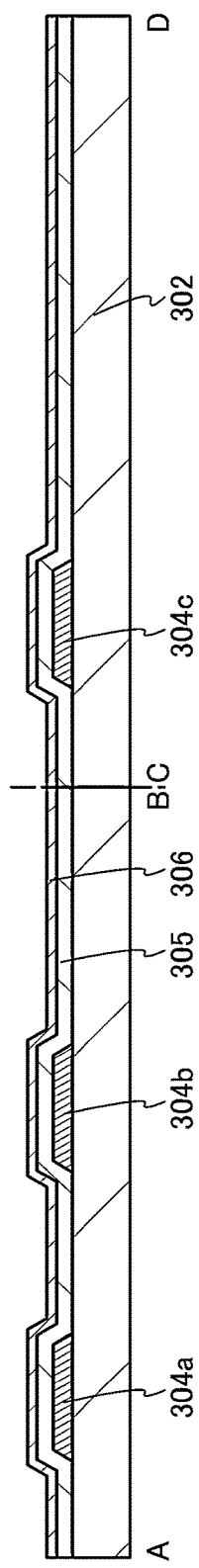
FIGS. 9A to 9C are cross-sectional views illustrating one embodiment of a method for manufacturing a semiconductor device.

Next, the insulating film 305 is formed over the substrate 302 and the conductive films 304a, 304b, and 304c, and then the insulating film 306 is formed over the insulating film 305 (see FIG. 9A).

The insulating films 305 and 306 can be formed by a sputtering method, a CVD method, or the like. Note that it is preferable that the insulating films 305 and 306 be formed in succession in a vacuum, in which case entry of impurities is suppressed.

Figure 9B:
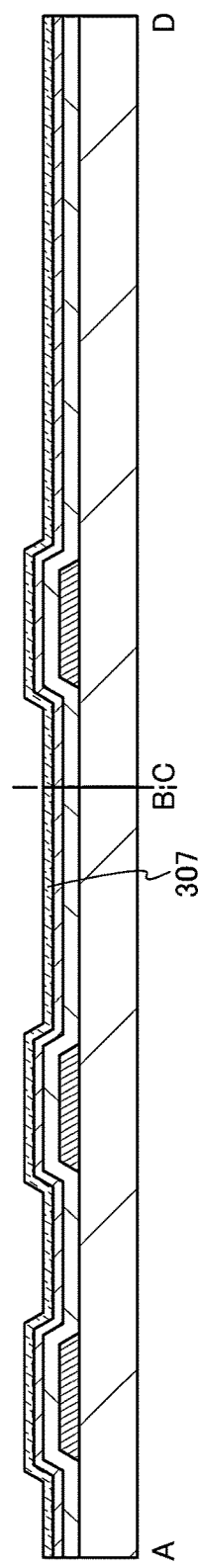
Figure 9C:
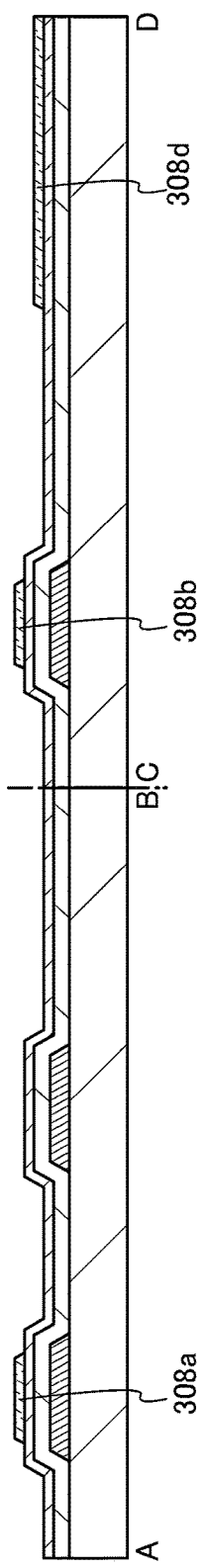

Next, a semiconductor film 307 is formed over the insulating film 306 (see FIG. 9B).

The semiconductor film 307 can be formed by a sputtering method, a coating method, a pulsed laser deposition method, a laser ablation method, or the like.

Next, the semiconductor film 307 is processed into desired regions, so that the island-shaped semiconductor films 308a, 308b, and 308d are formed. The semiconductor films 308a, 308b, and 308d can be formed in such a manner that a mask is formed in the desired regions by second patterning and regions not covered with the mask are etched. For the etching, dry etching, wet etching, or a combination of dry etching and wet etching can be employed (see FIG. 9C).

Next, first heat treatment may be performed. For the first heat treatment, conditions similar to those for the first heat treatment described in Embodiment 1 are used. By the first heat treatment, the crystallinity of the oxide semiconductor that is used for the semiconductor films 308a, 308b, and 308d can be improved, and in addition, impurities such as hydrogen and water can be removed from the insulating films 305 and 306 and the semiconductor films 308a, 308b, and 308d. The first heat treatment may be performed before the semiconductor film 307 is etched.

Next, a film 309 to be the first protective films, a conductive film 310, and a film 311 to be the second protective films are sequentially formed over the insulating film 306 and the semiconductor films 308a, 308b, and 308d (see FIG. 10A).

The film 309 to be the first protective films and the conductive film 310 can be formed by a sputtering method, for example. The film 311 to be the second protective films can be formed by a CVD method, a sputtering method, or the like, for example.

Next, the film 311 to be the second protective films is processed into desired regions, so that the second protective films 312a, 312b, and 312d and second protective films 312c and 312e are formed. The second protective films 312a, 312b, 312c, 312d, and 312e can be formed in such a manner that a mask is formed in the desired regions by third patterning and regions not covered with the mask are etched. Then, the mask is removed (see FIG. 10B).

Next, the conductive film 310 and the film 309 to be the first protective films are processed into desired regions, so that the conductive films 313a, 313b, 313c, 313d, and 313e and the first protective films 314a, 314b, 314c, 314d, and 314e are formed. Here, the conductive films 313a, 313b, 313c, 313d, and 313e and the first protective films 314a, 314b, 314c, 314d, and 314e can be formed in such a manner that the second protective films 312a, 312b, 312c, 312d, and 312e are used as a mask and regions not covered with the mask are etched (see FIG. 10C).

Then, an insulating film 315 is formed so as to cover the insulating film 306, the semiconductor films 308a, 308b, and 308d, the second protective films 312a, 312b, 312c, 312d, and 312e, the conductive films 313a, 313b, 313c, 313d, and 313e, and the first protective films 314a, 314b, 314c, 314d, and 314e (see FIG. 11A).

The insulating film 315 can be formed with a stacked-layer structure under conditions similar to those for the oxide insulating film 23 and the oxide insulating film 24 in Embodiment 1.

Next, the insulating film 315 is processed into desired regions, so that the insulating film 316 and the opening 362 are formed. The insulating film 316 and the opening 362 can be formed in such a manner that a mask is formed in a desired region by fourth patterning and regions not covered with the mask are etched (see FIG. 11B).

The opening 362 is formed so as to expose the surface of the semiconductor film 308d. An example of a formation method of the opening 362 includes, but not limited to, a dry etching method. Alternatively, a wet etching method or a combination of dry etching and wet etching can be employed for formation of the opening 362.

After that, second heat treatment may be performed. Part of oxygen contained in the insulating film 316 can be moved to the semiconductor films 308a and 308b, so that oxygen vacancies contained in the semiconductor films 308a and 308b can be reduced. Consequently, the amount of oxygen vacancies in the semiconductor films 308a and 308b can be reduced.

Next, an insulating film 317 is formed over the insulating film 316 and the semiconductor film 308d (see FIG. 11C).

The insulating film 317 is preferably formed using a material that can prevent an external impurity such as oxygen, hydrogen, water, alkali metal, or alkaline earth metal, from diffusing into the semiconductor film, more preferably formed using the material containing hydrogen, and typically an inorganic insulating material containing nitrogen, such as a nitride insulating film, can be used. The insulating film 317 can be formed by a CVD method, a sputtering method, or the like.

When the insulating film 317 is formed by a CVD method, a sputtering method, or the like, the semiconductor film 308d is exposed to plasma, so that oxygen vacancies are generated in the semiconductor film 308d. The insulating film 317 is a film formed using a material that prevents diffusion of impurities from the outside, such as water, alkali metal, and alkaline earth metal, into the semiconductor film, and the material further includes hydrogen. Thus, when hydrogen in the insulating film 317 is diffused into the semiconductor film 308d, hydrogen is bonded to oxygen vacancies and electrons serving as carriers are generated in the semiconductor film 308d. Alternatively, when hydrogen in the insulating film 317 is diffused into the semiconductor film 308d, hydrogen is bonded to oxygen and electrons serving as carriers are generated in the semiconductor film 308d. As a result, the conductivity of the semiconductor film 308d is increased, so that the semiconductor film 308d becomes the conductive film 308c.

The insulating film 317 is preferably formed at a high temperature to have an improved blocking property; for example, the insulating film 317 is preferably formed at a temperature in the range from the substrate temperature of 100° C. to the strain point of the substrate, more preferably at a temperature in the range from 300° C. to 400° C. When the insulating film 317 is formed at a high temperature, a phenomenon in which oxygen is released from the semiconductor films 308a and 308b and the carrier concentration is increased is caused in some cases; therefore, the upper limit of the temperature is a temperature at which the phenomenon is not caused.

Note that when the semiconductor film 308d is exposed to plasma containing a rare gas and hydrogen before the insulating film 317 is formed, oxygen vacancies can be formed in the semiconductor film 308d and hydrogen can be added to the semiconductor film 308d. As a result, electrons serving as carriers can be further increased in the semiconductor film 308d, and the conductivity of the conductive film 308c can be further increased.

Next, the insulating films 305, 306, 316, and 317 and the second protective films 312c and 312e are processed into desired regions, so that the openings 364a, 364b, and 364c are formed. Note that by etching in this step, the insulating film 317 is processed into the insulating film 318, and the second protective films 312c and 312e are processed into the second protective films 312f and 312g, respectively. The insulating film 318 and the openings 364a, 364b, and 364c can be formed in such a manner that a mask is formed in a desired region by fifth patterning and regions not covered with the mask are etched (see FIG. 12A). Note that in the case where the second protective films 312c and 312e are formed using a light-transmitting conductive film, the second protective films 312c and 312e are not necessarily etched in the step.

The opening 364a is formed so as to expose a surface of the conductive film 304b. The opening 364b is formed so as to expose the conductive film 313c. The opening 364c is formed so as to expose the conductive film 313e.

An example of a formation method of the openings 364a, 364b, and 364c includes, but not limited to, a dry etching method. Alternatively, a wet etching method or a combination of dry etching and wet etching can be employed for formation of the openings 364a, 364b, and 364c.

Figure 12B:
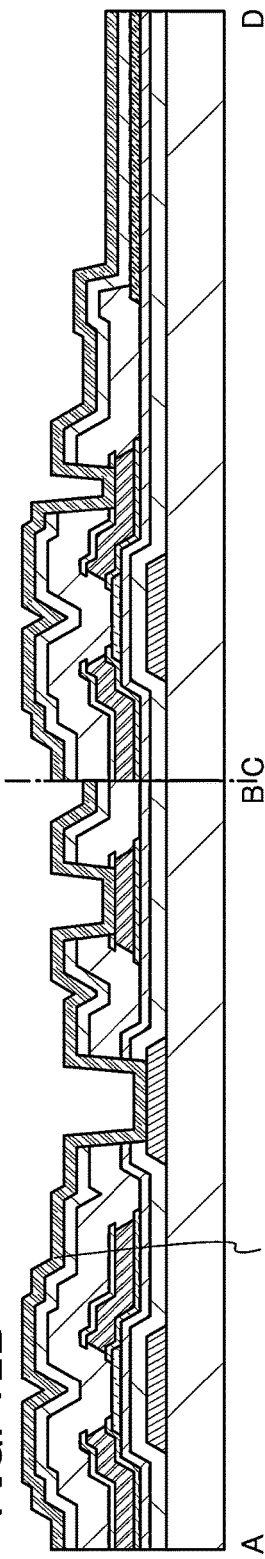
Figure 12C:
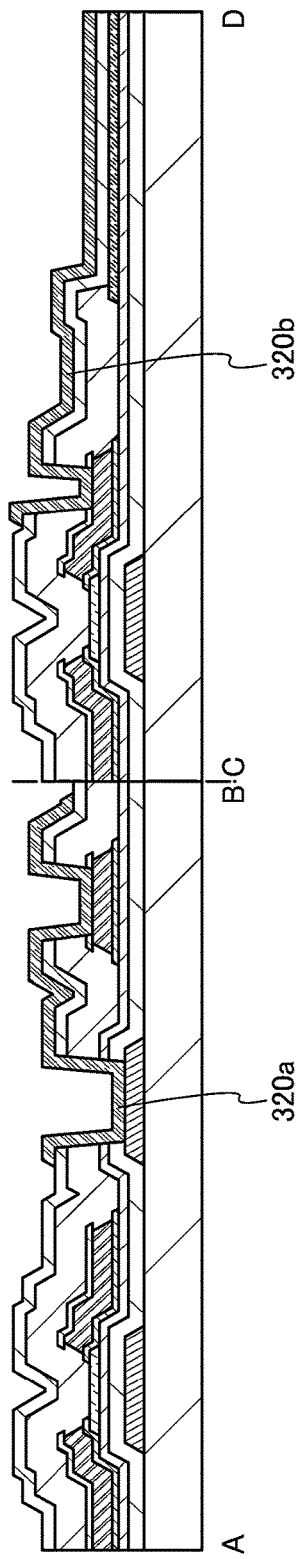

Then, a conductive film 319 is formed over the insulating film 318 so as to cover the openings 364a, 364b, and 364c (see FIG. 12B).

The conductive film 319 can be formed by a sputtering method, for example.

Then, the conductive film 319 is processed into desired regions to form the light-transmitting conductive films 320a and 320b. The light-transmitting conductive films 320a and 320b can be formed in such a manner that a mask is formed in the desired regions by sixth patterning and regions not covered with the mask are etched (see FIG. 12C).

Through the above process, the pixel portion and the driver circuit portion that include transistors can be formed over the substrate 302. In the manufacturing process described in this embodiment, the transistors and the capacitor can be formed at the same time by the first to sixth patterning, that is, with the six masks.

In this embodiment, the conductivity of the semiconductor film 308d is increased by diffusing hydrogen contained in the insulating film 318 into the semiconductor film 308d; however, the conductivity of the semiconductor film 308d may be increased by covering the semiconductor films 308a and 308b with a mask and adding impurities, typically, hydrogen, boron, phosphorus, tin, antimony, a rare gas element, alkali metal, alkaline earth metal, or the like to the semiconductor film 308d. Hydrogen, boron, phosphorus, tin, antimony, a rare gas element, or the like may be added to the semiconductor film 308d by an ion doping method, an ion implantation method, or the like. Further, alkali metal, alkaline earth metal, or the like may be added to the semiconductor film 308d by a method in which the semiconductor film 308d is exposed to a solution that contains the impurity.

Next, a structure that is formed over the substrate 342 provided so as to face the substrate 302 is described below.

Figure 13A:
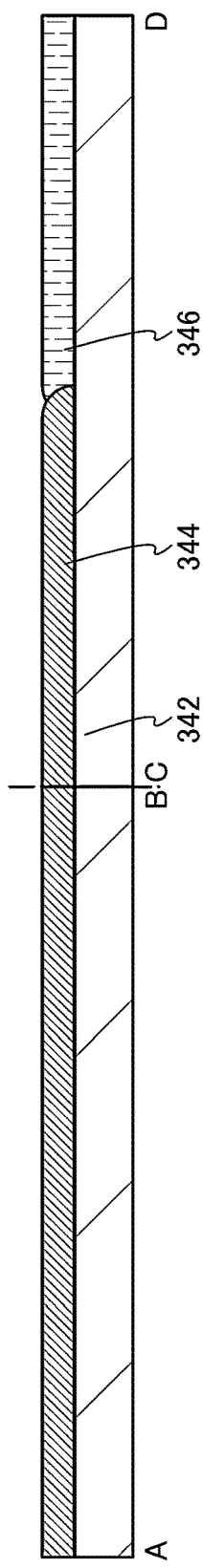
FIGS. 13A to 13C are cross-sectionals views illustrating one embodiment of a method for manufacturing a semiconductor device.

First, the substrate 342 is prepared. For materials of the substrate 342, the materials that can be used for the substrate 302 can be referred to. Then, the light-blocking film 344 and the coloring film 346 are formed over the substrate 342 (see FIG. 13A).

The light-blocking film 344 and the coloring film 346 each are formed in a desired position with any of various materials by a printing method, an inkjet method, an etching method using a photolithography technique, or the like.

Figure 13B:
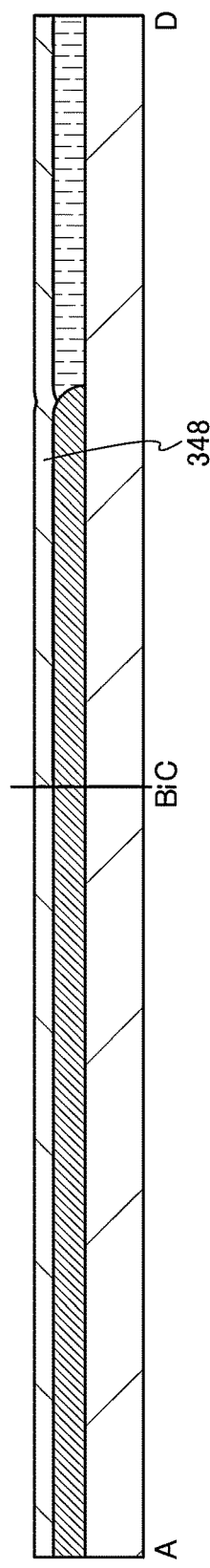

Then, the insulating film 348 is formed over the light-blocking film 344 and the coloring film 346 (see FIG. 13B).

For the insulating film 348, an organic insulating film of an acrylic resin, an epoxy resin, polyimide, or the like can be used. With the insulating film 348, an impurity or the like contained in the coloring film 346 can be prevented from diffusing into the liquid crystal layer 321 side, for example. Note that the insulating film 348 is not necessarily formed.

Figure 13C:
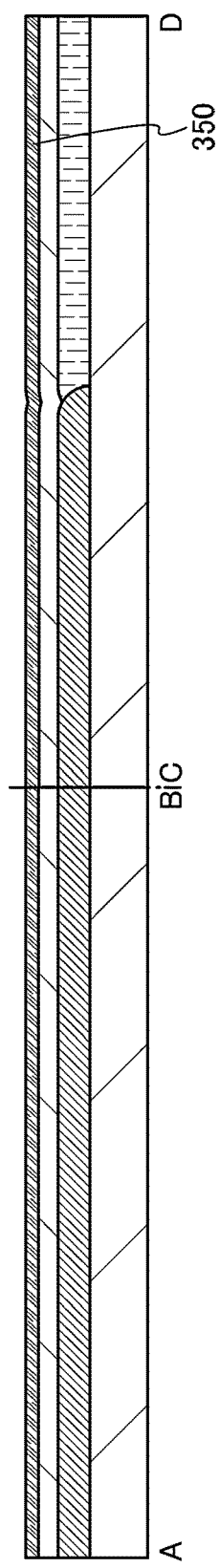

Then, the conductive film 350 is formed over the insulating film 348 (see FIG. 13C). As the conductive film 350, a material that can be used for the conductive film 319 can be used.

Through the above process, the structure formed over the substrate 342 can be formed.

Next, the alignment film 323 and the alignment film 352 are formed over the substrate 302 and the substrate 342 respectively, specifically, over the insulating film 318 and the light-transmitting conductive films 320a and 320b formed over the substrate 302 and over the conductive film 350 formed over the substrate 342. The alignment films 323 and 352 can be formed by a rubbing method, an optical alignment method, or the like. After that, the liquid crystal layer 321 is formed between the substrate 302 and the substrate 342. The liquid crystal layer 321 can be formed by a dispenser method (a dropping method), or an injecting method by which a liquid crystal is injected using a capillary phenomenon after the substrate 302 and the substrate 342 are bonded to each other.

Through the above process, the display device illustrated in FIG. 8 can be fabricated.

This embodiment can be combined with any of the other embodiments in this specification as appropriate.

Embodiment 5

In this embodiment, one embodiment which can be applied to the semiconductor film 14 and the oxide film 15 in any of the transistors included in the semiconductor device described in the above embodiment is described. Note that an oxide semiconductor is used here for the semiconductor film 14. An oxide semiconductor film is described as an example; further, the oxide film can have a similar structure.

An oxide semiconductor film is classified roughly into a non-single-crystal oxide semiconductor film and a single crystal oxide semiconductor film. The non-single-crystal oxide semiconductor film includes any of a c-axis aligned crystalline oxide semiconductor (CAAC-OS) film, a polycrystalline oxide semiconductor film, a microcrystalline oxide semiconductor film, an amorphous oxide semiconductor film, and the like. Here, a CAAC-OS film and a microcrystalline oxide semiconductor film are described.

First, a CAAC-OS film is described.

The CAAC-OS film is one of oxide semiconductor films including a plurality of crystal parts, and most of the crystal parts each fit inside a cube whose one side is less than 100 nm. Thus, there is a case where a crystal part included in the CAAC-OS film fits inside a cube whose one side is less than 10 nm, less than 5 nm, or less than 3 nm. The density of defect states of the CAAC-OS film is lower than that of the microcrystalline oxide semiconductor film.

In a transmission electron microscope (TEM) image of the CAAC-OS film, a boundary between crystal parts, that is, a grain boundary is not clearly observed. Thus, in the CAAC-OS film, a reduction in electron mobility due to the grain boundary is less likely to occur.

According to a TEM image of the CAAC-OS film observed in a direction substantially parallel to a sample surface (cross-sectional TEM image), metal atoms are arranged in a layered manner in the crystal parts. Each metal atom layer has a morphology reflected by a surface where the CAAC-OS film is formed (hereinafter, a surface where the CAAC-OS film is formed is also referred to as a formation surface) or a top surface of the CAAC-OS film, and is arranged in parallel to the formation surface or the top surface of the CAAC-OS film.

Note that here, the term "parallel" indicates that the angle formed between two straight lines is greater than or equal to −10° and less than or equal to 10°, and accordingly also includes the case where the angle is greater than or equal to −5° and less than or equal to 5°. In addition, the term "perpendicular" indicates that the angle formed between two straight lines is greater than or equal to 80° and less than or equal to 100°, and accordingly also includes the case where the angle is greater than or equal to 85° and less than or equal to 95°.

On the other hand, according to a TEM image of the CAAC-OS film observed in a direction substantially perpendicular to the sample surface (plan TEM image), metal atoms are arranged in a triangular or hexagonal configuration in the crystal parts. However, there is no regularity of arrangement of metal atoms between different crystal parts.

Note that in an electron diffraction pattern of the CAAC-OS film, spots (bright spots) having alignment are shown.

From the results of the cross-sectional TEM image and the plan TEM image, alignment is found in the crystal parts in the CAAC-OS film.

Figure 14A:
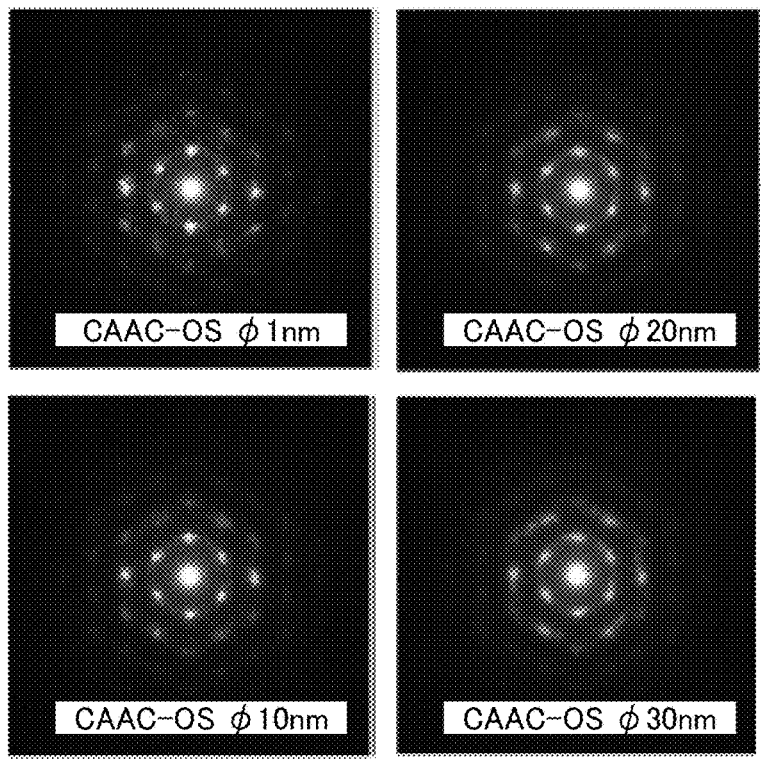
FIGS. 14A and 14B are nanobeam electron diffraction patterns of oxide semiconductor films.

FIG. 14A shows results of nanobeam electron diffraction from a surface side of a CAAC-OS sample obtained by thinning from 100 nm to 50 nm. The diameter of the electron beam was 1 nm (denoted by φ1 nm), 10 nm (denoted by φ10 nm), 20 nm (denoted by φ20 nm), or 30 nm (denoted by φ30 nm). Under all conditions, alignment in a particular direction has been confirmed. The results also show that as the diameter of the electron beam decreases, the degree of alignment increases.

A CAAC-OS film is subjected to structural analysis with an X-ray diffraction (XRD) apparatus. For example, when the CAAC-OS film including an $InGaZnO_4$ crystal is analyzed by an out-of-plane method, a peak appears frequently when the diffraction angle (2θ) is around 31°. This peak is derived from the (009) plane of the $InGaZnO_4$ crystal, which indicates that crystals in the CAAC-OS film have c-axis alignment, and that the c-axes are aligned in a direction substantially perpendicular to the formation surface or the top surface of the CAAC-OS film.

On the other hand, when the CAAC-OS film is analyzed by an in-plane method in which an X-ray enters a sample in a direction substantially perpendicular to the c-axis, a peak appears frequently when 2θ is around 56°. This peak is derived from the (110) plane of the $InGaZnO_4$ crystal. Here, analysis (φ scan) is performed under conditions where the sample is rotated around a normal vector of a sample surface as an axis (φ axis) with 2θ fixed at around 56°. In the case where the sample is a single crystal oxide semiconductor film of $InGaZnO_4$, six peaks appear. The six peaks are derived from crystal planes equivalent to the (110) plane. On the other hand, in the case of a CAAC-OS film, a peak is not clearly observed even when (I) scan is performed with 2θ fixed at around 56°.

According to the above results, in the CAAC-OS film having c-axis alignment, while the directions of a-axes and b-axes are different between crystal parts, the c-axes are aligned in a direction parallel to a normal vector of a formation surface or a normal vector of a top surface. Thus, each metal atom layer arranged in a layered manner observed in the cross-sectional TEM image corresponds to a plane parallel to the a-b plane of the crystal.

Note that the crystal part is formed concurrently with deposition of the CAAC-OS film or is formed through crystallization treatment such as heat treatment. As described above, the c-axis of the crystal is aligned in a direction parallel to a normal vector of a formation surface or a normal vector of a top surface of the CAAC-OS film. Thus, for example, in the case where a shape of the CAAC-OS film is changed by etching or the like, the c-axis might not be necessarily parallel to a normal vector of a formation surface or a normal vector of a top surface of the CAAC-OS film.

Further, distribution of c-axis aligned crystal parts in the CAAC-OS film is not necessarily uniform. For example, in the case where crystal growth leading to the crystal parts of the CAAC-OS film occurs from the vicinity of the top surface of the film, the proportion of the c-axis aligned crystal parts in the vicinity of the top surface is higher than that in the vicinity of the formation surface in some cases. Further, when an impurity is added to the CAAC-OS film, a region to which the impurity is added is altered, and the proportion of the crystal parts in the CAAC-OS film varies depending on regions, in some cases.

Note that when the CAAC-OS film with an $InGaZnO_4$ crystal is analyzed by an out-of-plane method, a peak of 2θ may also be observed at around 36°, in addition to the peak of 2θ at around 31°. The peak of 2θ at around 36° indicates that a crystal having no c-axis alignment is included in part of the CAAC-OS film. It is preferable that in the CAAC-OS film, a peak of 2θ appear at around 31° and a peak of 2θ do not appear at around 36°.

The CAAC-OS film is an oxide semiconductor film with a low impurity concentration. The impurity is an element other than the main components of the oxide semiconductor film, such as hydrogen, carbon, silicon, or a transition metal element. In particular, an element that has higher bonding strength to oxygen than a metal element included in the oxide semiconductor film, such as silicon, disturbs the atomic arrangement of the oxide semiconductor film by depriving the oxide semiconductor film of oxygen and causes a decrease in crystallinity. Further, a heavy metal such as iron or nickel, argon, carbon dioxide, or the like has a large atomic radius (molecular radius), and thus disturbs the atomic arrangement of the oxide semiconductor film and causes a decrease in crystallinity when it is contained in the oxide semiconductor film. Note that the impurity contained in the oxide semiconductor film might serve as a carrier trap or a carrier generation source.

The CAAC-OS film is an oxide semiconductor film having a low density of defect states. In some cases, oxygen vacancies in the oxide semiconductor film serve as carrier traps or serve as carrier generation sources when hydrogen is captured therein.

The state in which the impurity concentration is low and the density of defect states is low (the number of oxygen vacancies is small) is referred to as a "highly purified intrinsic" or "substantially highly purified intrinsic" state. A highly purified intrinsic or substantially highly purified intrinsic oxide semiconductor film has few carrier generation sources, and thus can have a low carrier density. Thus, a transistor including the oxide semiconductor film rarely has negative threshold voltage (is rarely normally on). The highly purified intrinsic or substantially highly purified intrinsic oxide semiconductor film has few carrier traps. Accordingly, the transistor including the oxide semiconductor film has little variation in electrical characteristics and has high reliability. Electric charges trapped by the carrier traps in the oxide semiconductor film take a long time to be released, and might behave like fixed electric charges. Thus, the transistor which includes the oxide semiconductor film having high impurity concentration and a high density of defect states has unstable electrical characteristics in some cases.

With use of the CAAC-OS film in a transistor, a variation in the electrical characteristics of the transistor due to irradiation with visible light or ultraviolet light is small.

Next, a microcrystalline oxide semiconductor film is described.

In an image obtained with the TEM, crystal parts cannot be found clearly in the microcrystalline oxide semiconductor film in some cases. In most cases, the size of a crystal part in the microcrystalline oxide semiconductor film is greater than or equal to 1 nm and less than or equal to 100 nm, or greater than or equal to 1 nm and less than or equal to 10 nm. A microcrystal with a size greater than or equal to 1 nm and less than or equal to 10 nm, or a size greater than or equal to 1 nm and less than or equal to 3 nm, is specifically referred to as nanocrystal (nc). An oxide semiconductor film including nanocrystal is referred to as an nc-OS (nanocrystalline oxide semiconductor) film. In an image of the nc-OS film which is obtained with the TEM, for example, a boundary is not clearly detected in some cases.

In the nc-OS film, a microscopic region (for example, a region with a size greater than or equal to 1 nm and less than or equal to 10 nm, in particular, a region with a size greater than or equal to 1 nm and less than or equal to 3 nm) has a periodic atomic order. There is no regularity of crystal orientation between different crystal parts in the nc-OS film. Thus, the orientation of the whole film is not observed. Accordingly, in some cases, the nc-OS film cannot be distinguished from an amorphous oxide semiconductor film depending on an analysis method. For example, when the nc-OS film is subjected to structural analysis by an out-of-plane method with an XRD apparatus using an X-ray having a diameter larger than the size of a crystal part, a peak which shows a crystal plane does not appear. Further, a diffraction pattern like a halo pattern appears in a selected-area electron diffraction pattern of the nc-OS film which is obtained by using an electron beam having a diameter (e.g., larger than or equal to 50 nm) larger than the size of a crystal part. Meanwhile, spots are observed in an electron diffraction pattern of the nc-OS film obtained by using an electron beam having a diameter (e.g., larger than or equal to 1 nm and smaller than or equal to 30 nm) close to or smaller than the size of a crystal part. Further, in a nanobeam electron diffraction pattern of the nc-OS film, for example, bright regions in a circular (or ring-shaped) pattern are shown in some cases. Also in a nanobeam electron diffraction pattern of the nc-OS film, a plurality of spots are shown in a ring-like region in some cases.

Figure 14B:
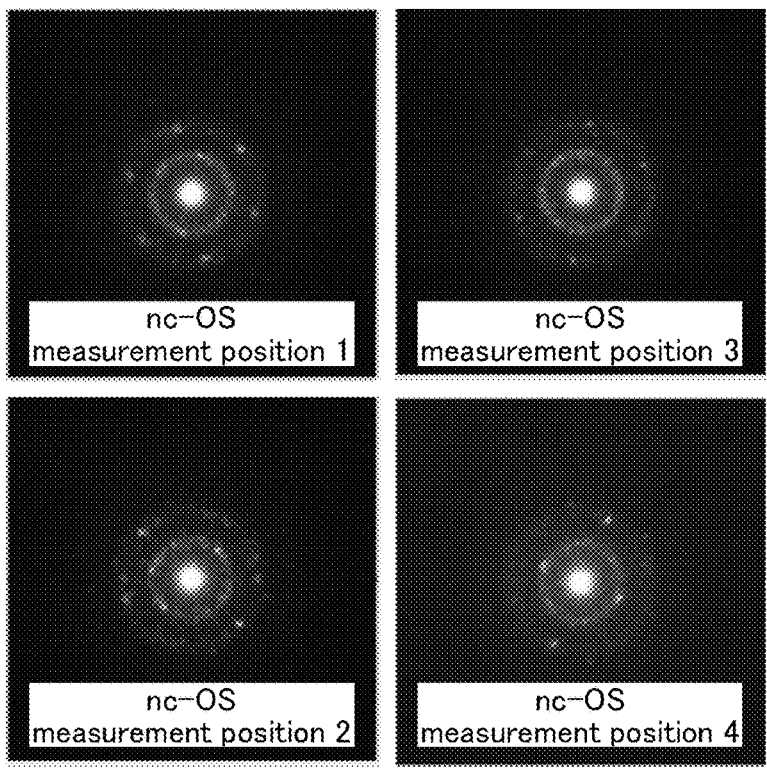

FIG. 14B shows examples of nanobeam electron diffraction from a sample including an nc-OS film. The measurement position is changed. Here, the sample is cut in the direction perpendicular to a surface where the nc-OS film is formed and the thickness thereof is reduced to be less than or equal to 10 nm. Further, an electron beam with a diameter of 1 nm enters from the direction perpendicular to the cut surface of the sample. FIG. 14B shows that, when a nanobeam electron diffraction is performed on the sample including the nc-OS film, a diffraction pattern exhibiting a crystal plane is obtained, but orientation along a crystal plane in a particular direction is not observed.

The nc-OS film is an oxide semiconductor film that has high regularity as compared to an amorphous oxide semiconductor film. Therefore, the nc-OS film has a lower density of defect states than an amorphous oxide semiconductor film. Note that there is no regularity of crystal orientation between different crystal parts in the nc-OS film. Therefore, the nc-OS film has a higher density of defect states than the CAAC-OS film.

Note that an oxide semiconductor film may be a stacked film including two or more kinds of an amorphous oxide semiconductor film, a microcrystalline oxide semiconductor film, and a CAAC-OS film, for example.

This application is based on Japanese Patent Application serial no. 2013-069163 filed with Japan Patent Office on Mar. 28, 2013, the entire contents of which are hereby incorporated by reference.

What is claimed is:

1. A method for manufacturing a semiconductor device comprising:

forming a first protective film, a conductive film, a second protective film, and a first mask in this order over a semiconductor film;

forming a pair of second protective films and a pair of conductive films by etching part of the second protective film and the conductive film by using the first mask;

removing the first mask, and then forming a pair of first protective films by etching part of the first protective film by using the pair of second protective films and the pair of conductive films as a second mask, so that side surfaces of the pair of conductive films are depressed in a cross section; and forming an insulating film over the semiconductor film, the pair of conductive films, and the pair of second protective films, wherein the side surfaces of the pair of conductive films are in contact with the insulating film, and wherein the first protective film is in direct contact with the conductive film.

2. The method according to claim 1, wherein each of the pair of conductive films comprises one of copper, aluminum, gold, silver, and molybdenum.

3. The method according to claim 1, wherein each of the pair of first protective films comprises one of titanium, tantalum, molybdenum, an alloy of titanium, an alloy of tantalum, an alloy of molybdenum, titanium nitride, tantalum nitride, and molybdenum nitride.

4. The method according to claim 1, wherein each of the pair of second protective films is one of a nitride insulating film, a light-transmitting conductive film, and an oxide semiconductor film.

5. The method according to claim 4, wherein the nitride insulating film comprises one of silicon nitride, silicon nitride oxide, aluminum nitride, and aluminum nitride oxide.

6. The method according to claim 4, wherein the light-transmitting conductive film comprises one of indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

7. The method according to claim 4, wherein the oxide semiconductor film comprises an oxide comprising at least one of indium, gallium, and zinc.

8. The method according to claim 1, wherein the semiconductor film is a film comprising silicon.

9. The method according to claim 1, wherein the semiconductor film is a film comprising at least one of In, Ga, and Zn.

10. The method according to claim 1,
wherein the semiconductor film comprises a first region not overlapped with the pair of first protective films, and a second region overlapped with the pair of first protective films,
wherein the first region has a smaller thickness than the second region, and
wherein the first region serves as a channel formation region.

11. A method for manufacturing a semiconductor device comprising:
forming a first protective film, a conductive film, and a second protective film over a semiconductor film;
forming a first mask over the second protective film;
forming a pair of second protective films and a pair of conductive films by etching part of each of the second protective film and the conductive film by using the first mask;
forming a pair of first protective films by etching part of the first protective film by using the pair of second protective films as a second mask after removing the first mask; and
forming an insulating film over the semiconductor film, the pair of conductive films, and the pair of second protective films,
wherein in a cross section, side surfaces of the pair of second protective films extend outward beyond side surfaces of the pair of conductive films,
wherein the side surfaces of the pair of conductive films are in contact with the insulating film, and
wherein the first protective film is in direct contact with the conductive film.

12. The method according to claim 11, wherein the first mask is removed by exposing the first mask to oxygen plasma.

13. The method according to claim 11, wherein each of the pair of conductive films comprises one of copper, aluminum, gold, silver, and molybdenum.

14. The method according to claim 11, wherein each of the pair of first protective films comprises one of titanium, tantalum, molybdenum, an alloy of titanium, an alloy of tantalum, an alloy of molybdenum, titanium nitride, tantalum nitride, and molybdenum nitride.

15. The method according to claim 11, wherein each of the pair of second protective films is one of a nitride insulating film, a light-transmitting conductive film, and an oxide semiconductor film.

16. The method according to claim 15, wherein the nitride insulating film comprises one of silicon nitride, silicon nitride oxide, aluminum nitride, and aluminum nitride oxide.

17. The method according to claim 15, wherein the light-transmitting conductive film comprises one of indium tin oxide, indium oxide containing tungsten oxide, indium zinc oxide containing tungsten oxide, indium oxide containing titanium oxide, indium tin oxide containing titanium oxide, indium zinc oxide, and indium tin oxide containing silicon oxide.

18. The method according to claim 15, wherein the oxide semiconductor film comprises an oxide comprising at least one of indium, gallium, and zinc.

19. The method according to claim 11, wherein the semiconductor film is a film comprising silicon.

20. The method according to claim 11, wherein the semiconductor film is a film comprising at least one of In, Ga, and Zn.

21. The method according to claim 11,
wherein the semiconductor film comprises a first region not overlapped with the pair of first protective films, and a second region overlapped with the pair of first protective films,
wherein the first region has a smaller thickness than the second region, and
wherein the first region serves as a channel formation region.

22. A method for manufacturing a semiconductor device comprising:
forming a first film over a semiconductor film;
forming a second film over the first film;
forming a third film over the second film;
forming a first mask over the third film;
etching the second film and the third film to form a pair of second films and a pair of third films by using the first mask; and
etching the first film to form a pair of first films by using the pair of second films and the pair of third films as a second mask after removing the first mask,
wherein the first film is in direct contact with the second film.

23. The method according to claim 22, further comprising:
forming a fourth film comprising an insulator over the semiconductor film, the pair of second films, and the pair of third films,
wherein side surfaces of the pair of second films are in contact with the fourth film.

24. The method according to claim 22, wherein the first film contains one of Ti, Ta, and Mo.

25. The method according to claim 22, wherein the second film contains one of Cu, Al, Au, Ag, and Mo.

26. The method according to claim 22, wherein the third film is one of a nitride insulating film, a light-transmitting conductive film, and an oxide semiconductor film.

27. The method according to claim 22, wherein the semiconductor film contains at least one of In, Ga, and Zn.

\* \* \* \* \*